US006747395B1

(12) United States Patent
Satoh et al.

(10) Patent No.: US 6,747,395 B1
(45) Date of Patent: Jun. 8, 2004

(54) PIEZOELECTRIC LOUDSPEAKER

(75) Inventors: Kazue Satoh, Osaka (JP); Hiroyuki Takewa, Osaka (JP); Mikio Iwasa, Osaka (JP); Mitsukazu Kuze, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/431,201

(22) Filed: Nov. 1, 1999

(30) Foreign Application Priority Data

| | | |
|---|---|---|
| Nov. 2, 1998 | (JP) | 10-311770 |
| Sep. 8, 1999 | (JP) | 11-254416 |
| Sep. 13, 1999 | (JP) | 11-258577 |

(51) Int. Cl.[7] ........ H01L 41/08
(52) U.S. Cl. ........ 310/324; 310/327
(58) Field of Search ........ 310/324, 326, 310/327, 317

(56) References Cited

U.S. PATENT DOCUMENTS

| | | | | | |
|---|---|---|---|---|---|
| 2,427,062 | A | * | 9/1947 | Massa | 367/155 |
| 3,846,650 | A | * | 11/1974 | Barrow | 310/324 |
| 4,654,554 | A | * | 3/1987 | Kishi | 381/158 |
| 5,161,200 | A | * | 11/1992 | Barr | 319/324 |
| 5,321,761 | A | * | 6/1994 | Kitanishi | 310/317 |
| 5,446,332 | A | * | 8/1995 | Rapps et al. | 310/324 |
| 5,577,319 | A | * | 11/1996 | Knecht | 29/827 |
| 6,278,790 | B1 | * | 8/2001 | Davis et al. | 310/324 |

FOREIGN PATENT DOCUMENTS

| | | | | |
|---|---|---|---|---|
| FR | 2574609 | * | 2/1990 | 310/324 |
| JP | 61-150500 | * | 7/1986 | 310/324 |
| JP | 62-14600 | * | 1/1987 | 310/324 |
| JP | 62-137000 | | 6/1987 | H04R/17/00 |
| JP | 63-81595 | | 5/1988 | H04R/17/00 |
| JP | 1-135299 | | 5/1989 | H04R/17/00 |
| JP | 02-058998 | | 2/1990 | H04R/17/00 |
| JP | 3-175800 | * | 7/1991 | 310/324 |

* cited by examiner

*Primary Examiner*—Thomas M. Dougherty
(74) *Attorney, Agent, or Firm*—RatnerPrestia

(57) ABSTRACT

A piezoelectric loudspeaker includes: a piezoelectric vibrator including a diaphragm and a piezoelectric member provided on at least one face of the diaphragm, the diaphragm being vibrated by the piezoelectric member; a frame for supporting the piezoelectric vibrator; and a visco-elastic member provided on at least one face of the piezoelectric vibrator. The visco-elastic member is disposed in a substantial center of the piezoelectric vibrator. The visco-elastic member has a bottom face area which accounts for about 11% to about 80% of a bottom face area of the diaphragm.

17 Claims, 37 Drawing Sheets

1st resonance mode

2nd resonance mode

3rd resonance mode

4th resonance mode

5th resonance mode

6th resonance mode

Sec. A–B

PIEZOELECTRIC LOUDSPEAKER

BACKGROUND OF THE INVENTION

1. Field of the Invention

The present invention relates to a piezoelectric loudspeaker having flat reproduced sound volume characteristics in a wide range of frequencies.

2. Description of the Related Art

Conventional piezoelectric loudspeaker structures are disclosed in, for example, Japanese Laid-Open Utility Model Publication No. 63-81595 and Japanese Laid-Open Patent Publication No. 1-135299.

FIG. 38 illustrates the structure of a conventional piezoelectric loudspeaker disclosed in Japanese Laid-Open Utility Model Publication No. 63-81595. This conventional piezoelectric loudspeaker includes a piezoelectric diaphragm, which is composed of two thin piezoelectric members 31A and 31B electrodes 32A, 32B, 32C attached together, and a kneaded mixture 33 of metal powder and adhesive. Reference numerals 34A and 34B denote electrical input lines. The mixture 33 is adhered to the central portion of the piezoelectric diaphragm so as to damp the resonance peak Q at the resonance points of the piezoelectric loudspeaker, thereby improving the vibration mode characteristics. This technique of attaching visco-elastic member, i.e., the kneaded mixture 33 in a smaller diameter of the central portion of the diaphragm results in a somewhat reduced resonance peak. However, the amount of resonance attenuation obtained is well below a sufficient level. As a result, this conventional piezoelectric loudspeaker cannot attain sufficiently flat reproduced sound volume-frequency characteristics.

FIG. 39 illustrates the structure of a conventional piezoelectric loudspeaker disclosed in Japanese Laid-Open Patent Publication No. 1-135299. This conventional piezoelectric loudspeaker includes: a metal diaphragm 35; a piezoelectric vibrator composed of a thin piezoelectric member 36 attached to one side of the diaphragm 35; a soft damper plate 39 made of foam resin, rubber, or the like with the same outer diameter as that of the metal diaphragm 35 overlaid on the opposite side of the metal diaphragm 35: and a frame 37 for sandwiching the metal diaphragm 35 and the damper plate 39 at their outer peripheries around their entire circumferences for providing stable support for the metal diaphragm 35 and the damper plate 39. Reference numerals 38A and 38B denote electrical input lines. It is possible to impart this piezoelectric loudspeaker with various frequency characteristics by selecting the sandwiching pressure in accordance with the materials composing the metal diaphragm 35 and the damper plate 39. However, in accordance with the above conventional structure, the soft damper plate 39 and the metal diaphragm 35 are sandwiched by the frame 37 at their outer peripheries. Such a soft damper plate 39, extending all the way to the frame 37, may allow the vibratory force induced by the vibrator 36 to be transmitted into the frame 37. As a result, this conventional piezoelectric loudspeaker will not attain large vibration amplitude and hence it will not reproduce sounds at high sound volume.

Moreover, as the input voltage to the aforementioned conventional piezoelectric loudspeakers is increased, an excessive amplitude may occur, especially within the vicinity of the central portion of the piezoelectric vibrator. This may result in the 'peeling' of the piezoelectric member from the metal diaphragm, and even the destruction of the piezoelectrio vibrator.

It is known that the lowest reproducible frequency in the reproduced sound volume characteristics can be lowered as the diameter of the metal diaphragm is increased. However, this also creates a corresponding decrease in the highest reproducible frequency. Thus, it is difficult to attain a wide reproduction band width with the conventional piezoelectric loudspeakers of the type discussed above.

In a further case where a piezoelectric member is affixed on each side of the metal diaphragm, it is necessary to affix lead wires to both piezoelectric loudspeakers, and the lead wires must lead out from above and below the frame. This is aesthetically and electrically unpreferable, and may create problems such as peeling, entanglement, or even severance of the lead wires, resulting in a malfunction.

SUMMARY OF THE INVENTION

A piezoelectric loudspeaker according to the present invention includes: a piezoelectric vibrator including a diaphragm and a piezoelectric member provided on at least one face of the diaphragm, the diaphragm being vibrated by the piezoelectric member: a frame for supporting the piezoelectric vibrator: and a visco-elastic member provided on at least one face of the piezoelectric vibrator, wherein the visco-elastic member is disposed in a substantial center of the piezoelectric vibrator, and wherein the visco-elastic member has a bottom face area which accounts for about 11% to about 80% of a bottom face area of the diaphragm.

In one embodiment of the invention, the visco-elastic member includes two or more visco-elastic members stacked on top of each other, and the two or more types of visco-elastic members at least have different materials or different shapes.

In another embodiment of the invention, the visco-elastic member includes first and second visco-elastic members which are provided on opposite sides of the piezoelectric vibrator.

In still another embodiment of the invention, the first and second, visco-elastic members at least have different materials or different shapes.

In still another embodiment of the invention, the visco-elastic member includes two or more visco-elastic members having mutually different values in at least one of specific gravity, Young's modulus, and internal loss, and the two or more types of visco-elastic members are disposed in a concentric manner.

In still another embodiment of the invention, a rigid member is provided on the visco-elastic member, the rigid member having a specific gravity which is larger than a specific gravity of the visco-elastic member.

In still another embodiment of the invention, the piezoelectric vibrator has at least one aperture, the at least one aperture being at least partially filled by the visco-elastic member.

In still another embodiment of the invention, the frame has a horn-like configuration having an opening, the opening having a gradually increasing cross-sectional area away from the piezoelectric vibrator and toward a final opening at which soundwaves are emitted, and the visco-elastic member has a conical configuration having a gradually decreasing cross-sectional area away from the piezoelectric vibrator and toward the final opening.

In still another embodiment of the invention, the piezoelectric loudspeaker further includes an element provided in a central portion of the visco-elastic member, at least one of specific gravity and elastic modulus of the element being larger than specific gravity and/or elastic modulus of the visco-elastic member.

In still another embodiment of the invention, the visco-elastic member includes notches at least in one portion thereof.

Alternatively, the piezoelectric loudspeaker plurality of includes: a piezoelectric vibrator including a diaphragm and a piezoelectric member provided on at least one face of the diaphragm, the diaphragm being vibrated by the piezoelectric member; a frame for supporting the piezoelectric vibrator; and a support element for supporting the piezoelectric vibrator at a substantial center of the piezoelectric vibrator.

In one embodiment of the invention, the support element includes a conductive portion which is in electrical contact with the piezoelectric vibrator, and an electrical input is applied to the conductive portion.

In another embodiment of the invention, the loudspeaker further includes a visco-elastic member provided on at least one face of the piezoelectric vibrator.

Alternatively, the piezoelectric loudspeaker according to the present invention includes: a piezoelectric vibrator including a diaphragm and a plurality of piezoelectric members provided on at least one face of the diaphragm, the diaphragm being vibrated by the plurality of piezoelectric members; and a frame for supporting the piezoelectric vibrator, wherein different voltages are applied to at least two of the plurality of piezoelectric members.

In one embodiment of the invention, the piezoelectric loudspeaker further includes a visco-elastic member provided on at least one face of the piezoelectric vibrator.

In another embodiment of the invention, at least one of the plurality of piezoelectric members receives an electric input via an electrical resistance.

In still another embodiment of the invention, the plurality of piezoelectric members are defined by at least two split sections of the visco-elastic member provided on at least one face of the piezoelectric vibrator.

In still another embodiment of the invention, the piezoelectric loudspeaker further includes an electrically resistant member for interconnecting at least two of the plurality of piezoelectric members.

In still another embodiment of the invention, the piezoelectric loudspeaker further includes a plate for connecting at least one said visco-elastic member to the frame so as to damp unwanted vibration of the piezoelectric vibrator, wherein an enclosed space is formed by the plate, the frame, and the diaphragm.

In still another embodiment of the invention, the plate has at least through-hole.

In still another embodiment of the invention, the visco-elastic member includes a conductive portion which is in electrical contact with the piezoelectric vibrator, and an electrical input is applied to the conductive portion.

In still another embodiment of the invention, the piezoelectric loudspeaker further includes a lead wire for applying an electric input to the piezoelectric member, wherein the piezoelectric vibrator has at least one through-hole through which the lead wire is coupled to the piezoelectric member.

In still another embodiment of the invention, the piezoelectric loudspeaker further includes a cover for protecting at least one said visco-elastic member and the piezoelectric vibrator.

In still another embodiment of the invention, the piezoelectric loudspeaker further includes a conductive terminal for applying an electrical input to the piezoelectric member, the conductive terminal being provided within the cover.

Alternatively, the piezoelectric loudspeaker according to the present invention includes: a piezoelectric vibrator including a diaphragm and a piezoelectric member provided on at least one face of the diaphragm, the diaphragm being vibrated by the piezoelectric member: a frame for supporting the piezoelectric vibrator; and a visco-elastic member provided on at least one face of the piezoelectric vibrator, wherein the visco-elastic member is disposed in a substantial center of the piezoelectric vibrator, wherein the visco-elastic member has a bottom face area which accounts for about 11% to about 80% of a bottom face area of the diaphragm, and wherein the bottom face area of the visco-elastic member is equal to or greater than the bottom face area of the piezoelectric member, and a diameter of the visco-elastic member is smaller than the inner diameter of the frame.

In one embodiment of the invention, the frame includes a conductive portion which is in electrical contact with the piezoelectric vibrator, and an electrical input is applied to the conductive portion.

Thus, the invention described herein makes possible the advantage of providing a piezoelectric loudspeaker which attains a high reproduced sound volume level, a wide reproduction frequency band width, flat reproduced sound volume-frequency characteristics with a relatively simple structure.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples, with reference to the accompanying figures. Like elements of these figures are denoted by like numerals throughout the figures.

EXAMPLE 1

Figure 1:
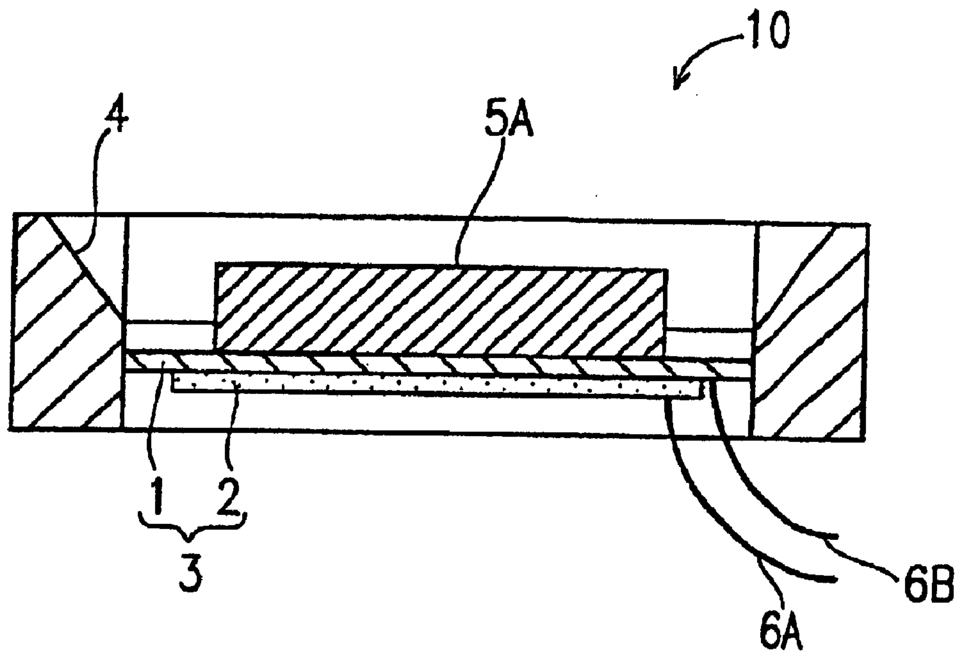
FIG. 1 is a cross-sectional view showing a piezoelectric loudspeaker according to Example 1 of the present invention.
Figure 2A:
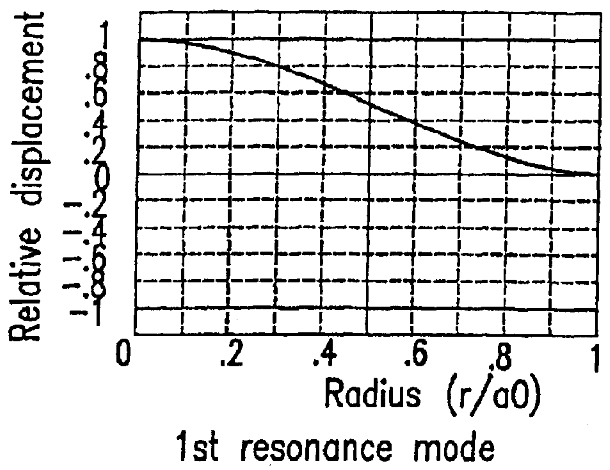
FIGS. 2A, 2B, 2C, 2D, 2E, and 2F are graphs illustrating a vibration mode of a piezoelectric vibrator.
Figure 2B:
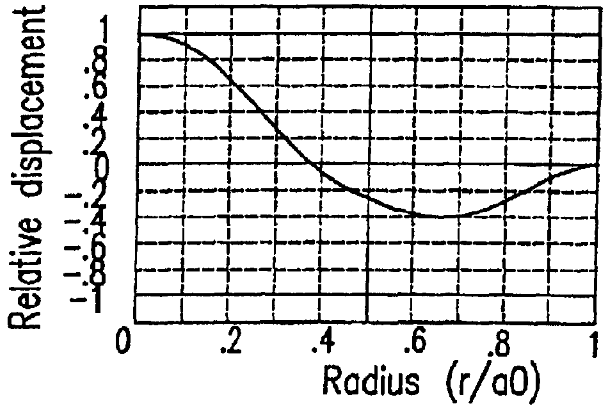
Figure 2C:
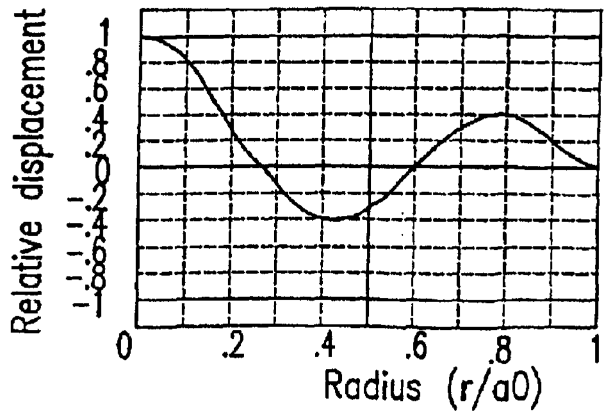
Figure 2D:
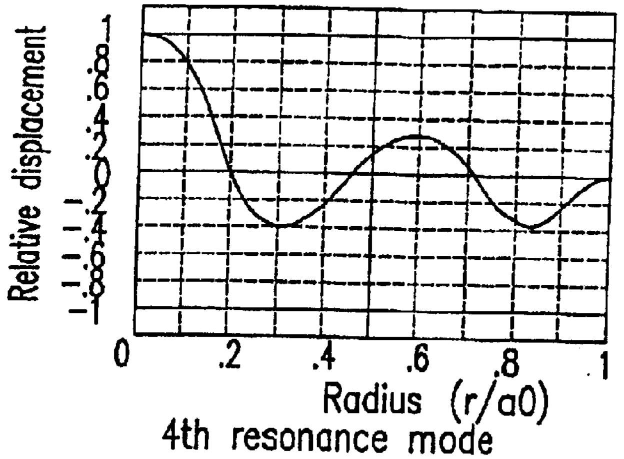
Figure 2E:
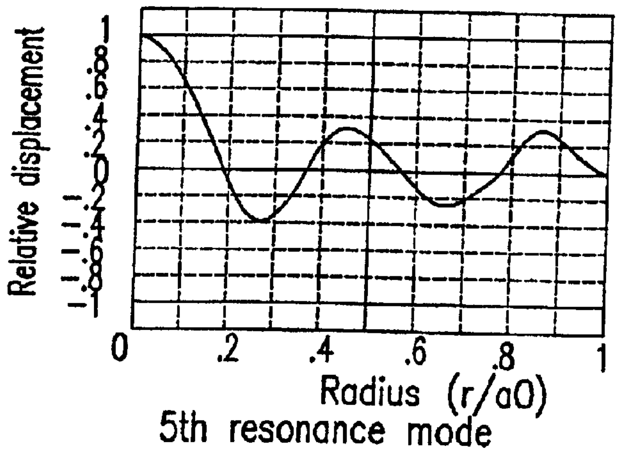
Figure 2F:
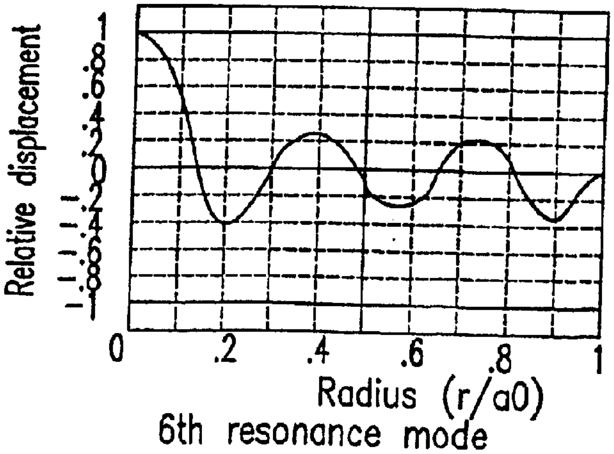

FIG. 1 is a cross-sectional view showing a piezoelectric loudspeaker according to Example 1 of the present invention. A piezoelectric vibrator 3 is composed essentially of a diaphragm 1 which is made of a metal or a polymer resin and a thin piezoelectric member 2 attached to the diaphragm 1. A voltage is applied to the piezoelectric member 2 via electric input lines 6A and 6B. The diaphragm 1 is affixed to or supported by a frame 4 at its outer periphery. A visco-elastic member 5A having a high internal loss (e.g., isobutylene-isoprene rubber, neoprene rubber, silicone rubber, or polyurethane foam) is attached to the diaphragm 1.

The operation of the piezoelectric loudspeaker 10 will now be described. When an audio signal is applied to the piezoelectric vibrator 3 (which is composed of the diaphragm 1 and the thin piezoelectric member 2), the piezoelectric vibrator 3 vibrates in a bending mode, causing the surrounding air to vibrate, whereby sound waves are generated. Since the piezoelectric vibrator 3 itself has substantially no internal loss, resonance may occur at certain frequencies.

Figure 3A:
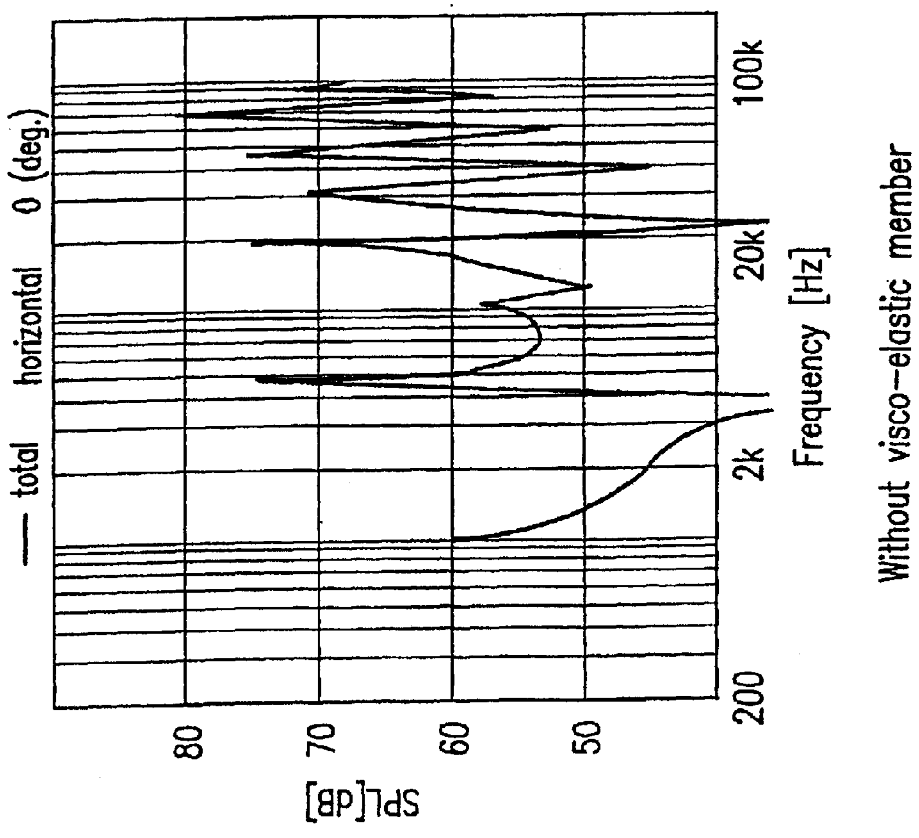
FIGS. 3A, 3B, and 3C are graphs illustrating the reproduced sound volume-frequency characteristics of a piezoelectric loudspeaker.

FIGS. 2A to 2F show the first to sixth resonance modes, respectively, of a circular-shape piezoelectric vibrator of a monomorph type, which includes a diaphragm 1 and a thin piezoelectric member attached to one side thereof, which is fixed at its outer periphery. Specifically, the graphs of FIGS. 2A to 2F illustrate the displacement characteristics of the circular diaphragm across its entire diameter (i.e., from its center to its outer periphery). It will be seen that the vibration amplitude greatly increases in the vicinity of each resonance point. Counter resonance may also occur at certain frequencies between the resonance points, where the vibration amplitude significantly decreases. Thus, the reproduced sound volume-frequency characteristics may exhibit a profile having large peaks and troughs. FIG. 3A shows one example of reproduced sound volume-frequency characteristics of such a piezoelectric vibrator.

According to the present invention, in order to minimize the amplitudes of such peaks and troughs of the sound volume characteristics, a visco-elastic member having a high internal loss is attached to the central portion of the piezoelectric vibrator 3. One particular finding made by the inventors is that the resonance can be controlled to varying degrees depending on the size and the like of the attached visco-elastic member.

Figure 3B:
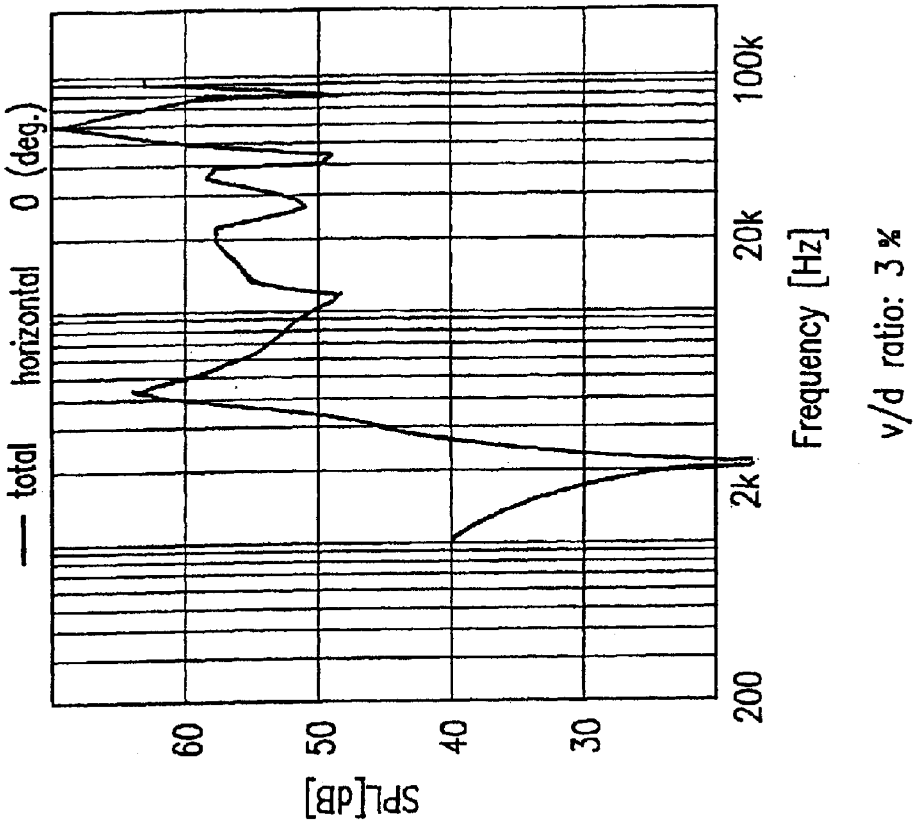
Figure 3C:
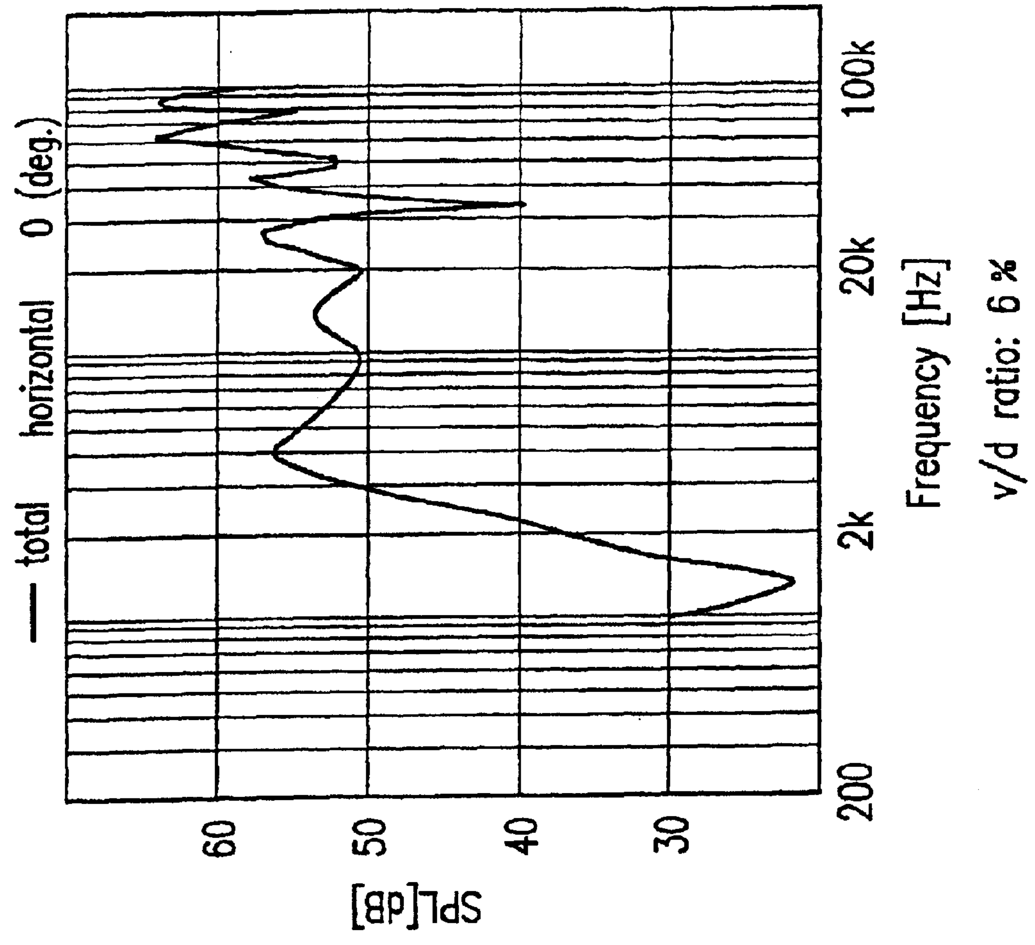
Figure 4B:
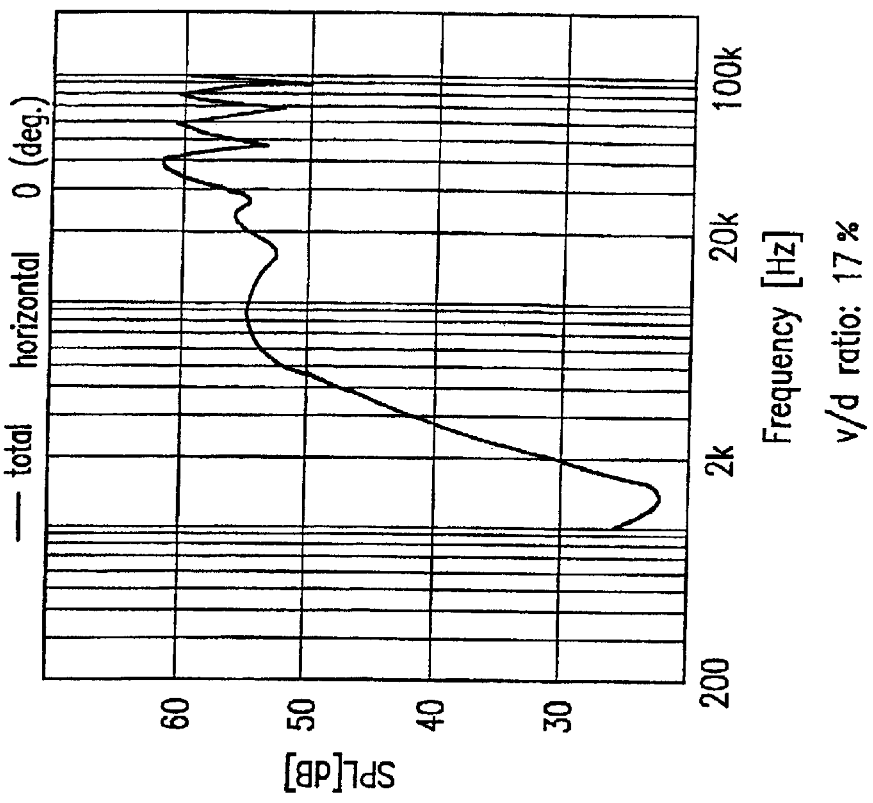
FIGS. 4A and 4B are graphs illustrating the reproduced sound volume-frequency characteristics of a piezoelectric loudspeaker.
Figure 4A:
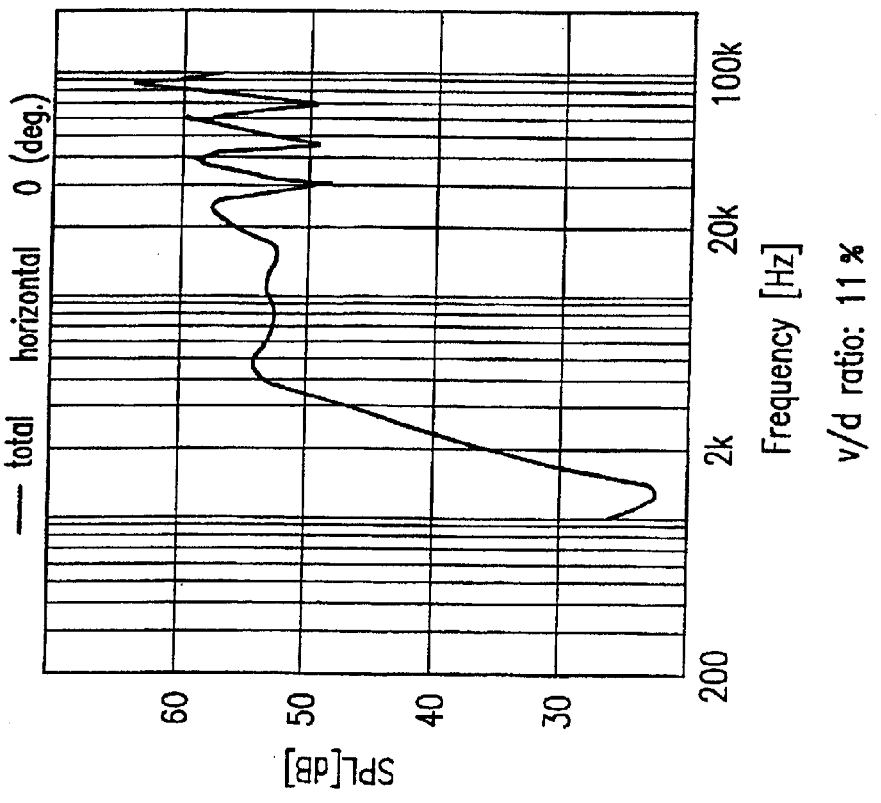
Figure 5A:
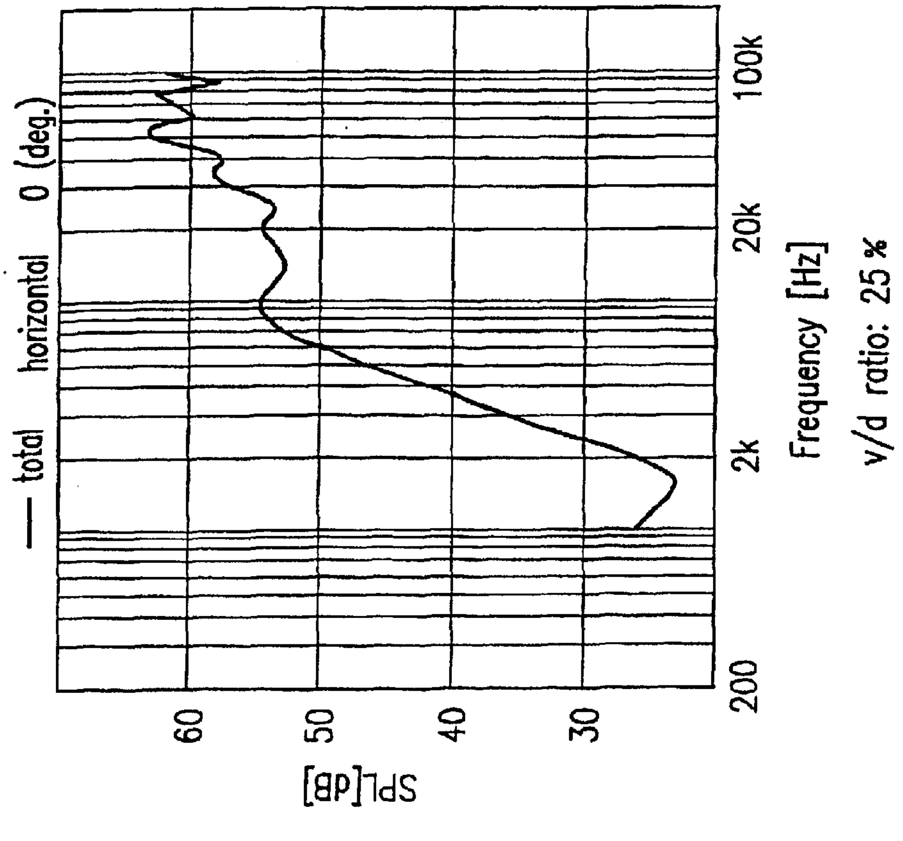
FIGS. 5A, 5B, and 5C are graphs illustrating the reproduced sound volume-frequency characteristics of a piezoelectric loudspeaker.
Figure 5B:
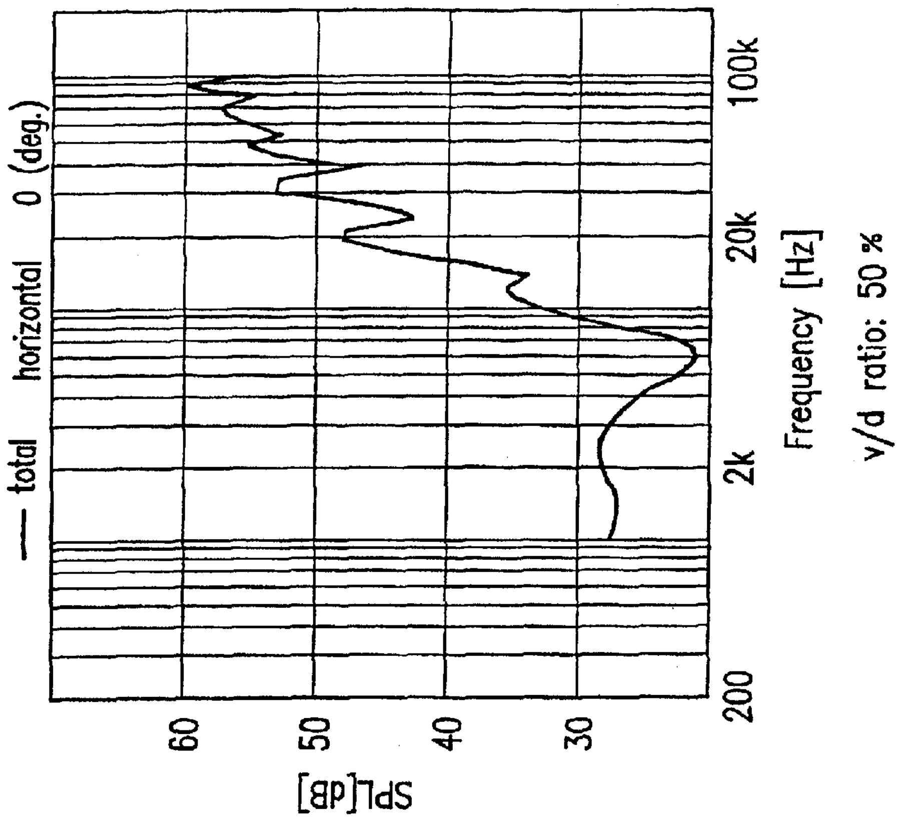
Figure 5C:
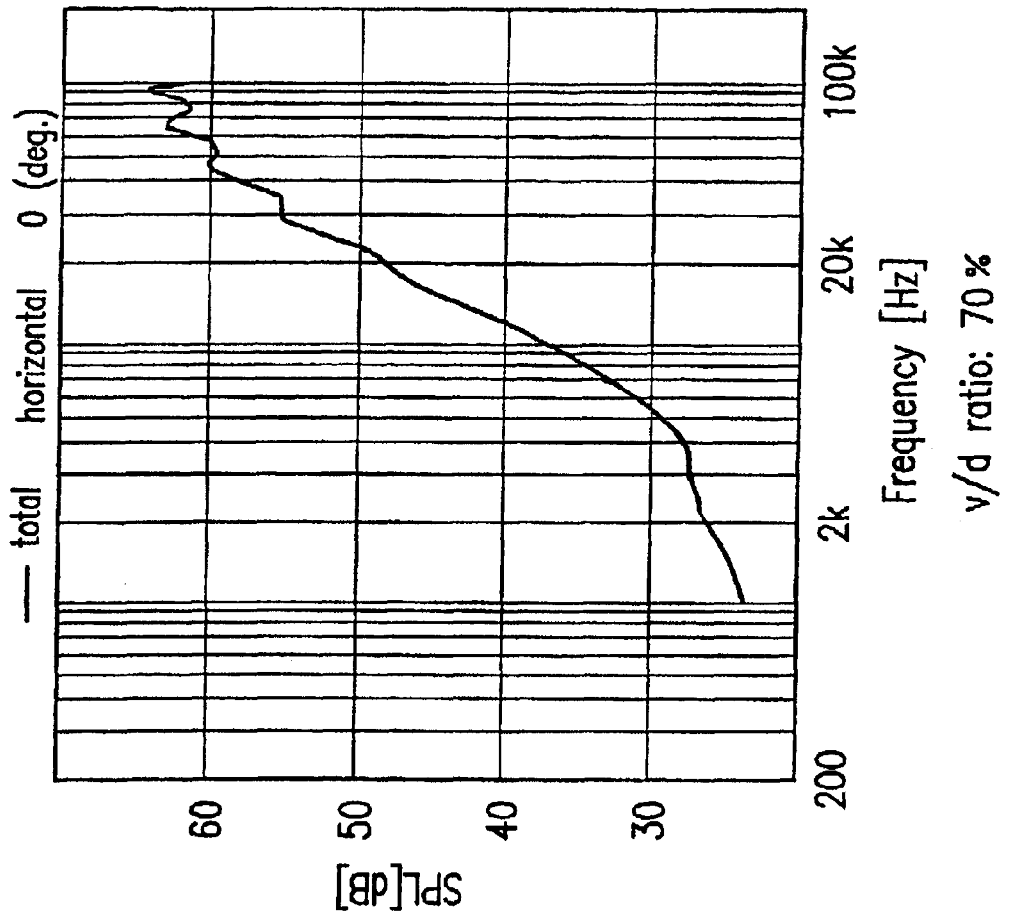
Figure 6A:
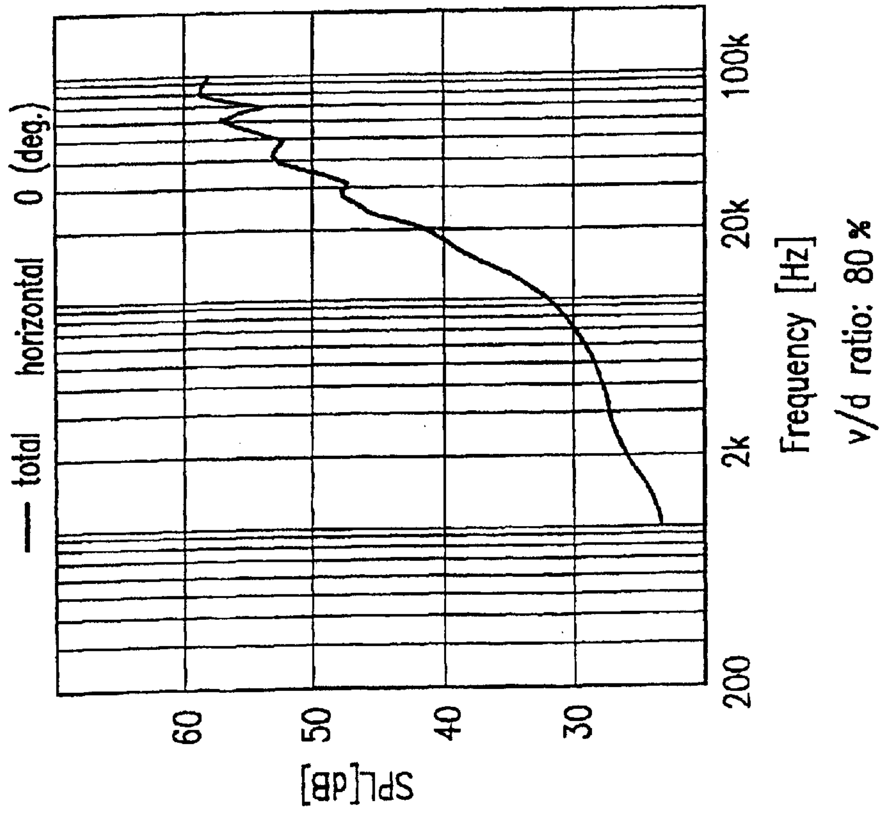
FIGS. 6A, 6B, and 6C are graphs illustrating the reproduced sound volume-frequency characteristics of a piezoelectric loudspeaker.
Figure 6B:
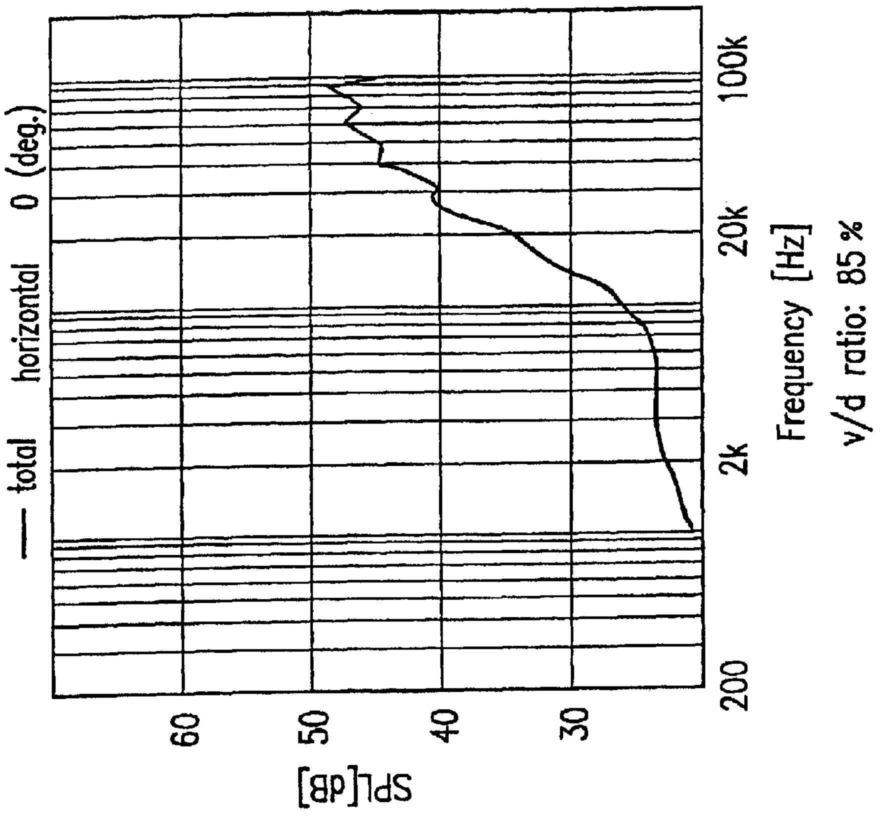
Figure 6C:
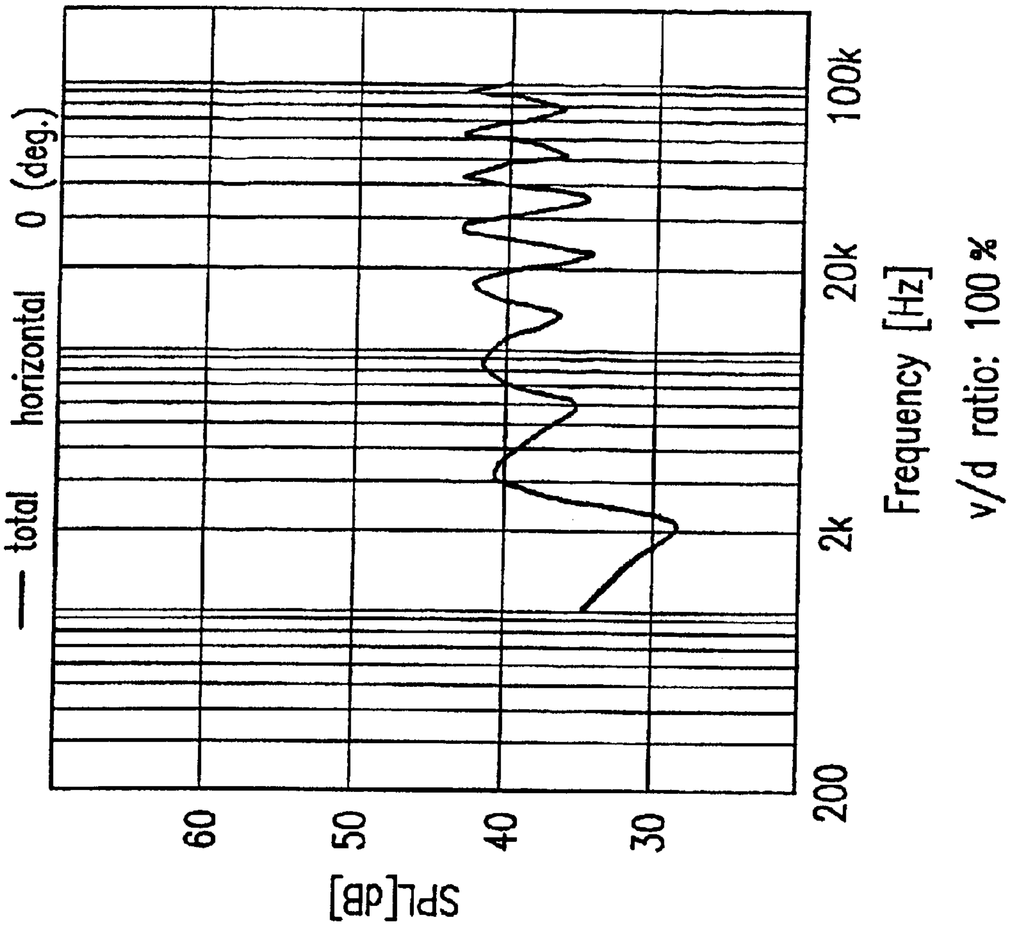

By way of illustration of the various degrees of resonance control possible by the use of a visco-elastic member, sample reproduced sound volume characteristics are shown in FIGS. 3B, 3C, 4A, 4B, 5A, 5B, 5C, 6A, 6B, and 6C. These characteristics were obtained when various sizes of visco-elastic members (thickness: about 5 mm) were attached to a diaphragm. Specifically, FIG. 3B illustrates the case where the bottom face area of the visco-elastic member accounts for about 3% (hereinafter this ratio may also be referred to as the "v/d ratio") of the bottom face area of the diaphragm; FIG. 3C illustrates the case of about 6% v/d ratio; FIG. 4A illustrates the case of about 11% v/d ratio; FIG. 4B illustrates the case of about 17% v/d ratio: FIG. 5A illustrates the case of about 25% v/d ratio; FIG. 5B illustrates the case of about 50% v/d ratio; FIG. 5C illustrates the case of about 70% v/d ratio; FIG. 6A illustrates the case of about 80% v/d ratio: FIG. 6B illustrates the case of about 85% v/d ratio; and FIG. 6C illustrates the case of about 100% v/d ratio.

Figure 38:
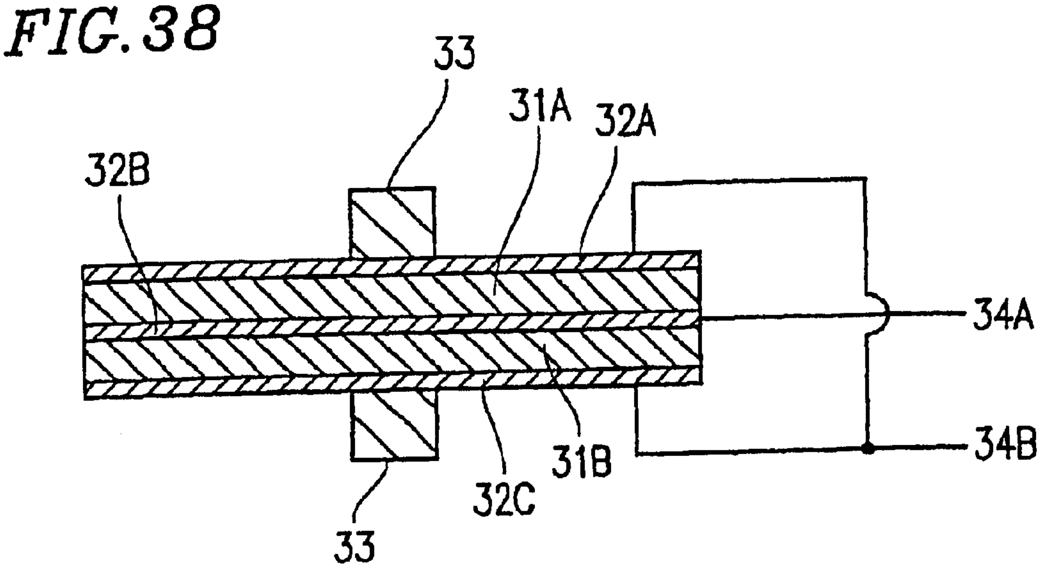
FIG. 38 is a cross-sectional view showing a conventional piezoelectric loudspeaker.
Figure 39:
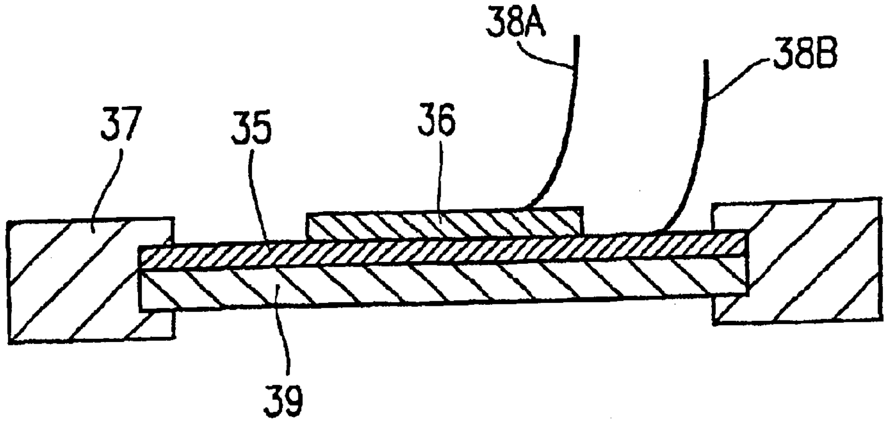
FIG. 39 is a cross-sectional view showing another conventional piezoelectric loudspeaker.

FIGS. 3B (about 3% v/d ratio) and 3C (about 6% v/d ratio) illustrate a case where a visco-elastic member 5A having a relatively small diameter is attached to the central portion of a diaphragm 1, as in the conventional structure shown in FIG. 38. In this case, the visco-elastic member is attached only to a central portion of the diaphragm which has a large vibration displacement (as seen from FIGS. 2A to 2F). Thus, the visco-elastic member will merely act as a mass on the piezoelectric vibrator, rather than as a means to control vibration, regardless of the high internal loss of the visco-elastic member 5A. Therefore, the amplitudes of the peaks and troughs in the reproduced sound volume characteristics due to resonance and counter-resonance may only be slightly reduced, if at all, by such a visco-elastic member 5A.

FIG. 6C (about 100% v/d ratio) illustrates a case where a visco-elastic member 5A is attached over the entire surface area of the diaphragm 1. In this case, the visco-elastic member 5A allows the vibratory energy to be leaked into the frame 4 via the outer periphery, where the visco-elastic member 5A is fixed to the frame 4. This however creates the problem of reduced sound volume level as described above.

FIG. 6B (about 85% v/d ratio) illustrates a case where a visco-elastic member 5A is attached over about 85% of the bottom face area of the diaphragm 1. In this case, too, the problem of reduced sound volume level still occurs because the portion of the piezoelectric vibrator 3 in which the visco-elastic member 5A is not attached to the diaphragm 1, which contributes most to the sound volume characteristics, only accounts for only a small area of about 15%.

FIG. 6A illustrates a case where the bottom face area of the visco-elastic member 5A accounts for about 80% of the bottom face area of the diaphragm 1. As can be seen from FIGS. 6A and 6B, the sound volume level attained with the 80% v/d ratio is as much as about 10 dB higher than that obtained with the v/d ratio of about 85%. Therefore, the loudspeaker of FIG. 6A can provide a sufficient sound volume level.

As seen from FIGS. 3A to 6C, flat reproduction characteristics can be attained in the case where the v/d ratio is in the range of about 11% to about 80%. As used herein, "flat reproduction characteristics" or "flat reproduced sound volume-frequency characteristics" are defined as a sound volume characteristices profile containing peaks and troughs with an amplitude difference of no more than about 20 dB across the frequency band within which the loudspeaker is operable.

For example, with a v/d ratio of about 11% (FIG. 4A), the sound volume characteristics have a variation of about 15 dB in the frequency band beginning at and above about 4 kHz. Thus, sufficient speaker characteristics are obtained.

With a v/d ratio of about 50% (FIG. 5B), the sound volume characteristics have a variation of about 18 dB in the frequency band beginning at and above about 20 kHz. This structure is suitable for use as a loudspeaker.

With a v/d ratio of about 80% (FIG. 6A), excellent frequency characteristics are obtained in the frequency band beginning at and above about 20 kHz.

Therefore, according to the present example of the invention, there is provided a structure in which a visco-elastic member 5A is attached to a diaphragm 1 of a piezoelectric vibrator 3 such that the visco-elastic member 5A has a bottom face area which accounts for about 11% to about 80% of the bottom face area of the diaphragm 1, and in which only the diaphragm 1 is directly coupled to a frame 4 at its outer periphery. The visco-elastic member 5A attached to the piezoelectric vibrator 3 is forced to undergo stretching motion due to the bending vibration of the piezoelectric vibrator 3. The stretching motion of the visco-elastic member 5A having a high internal loss serves to prevent the occurrence of a plurality of resonance modes. Since the visco-elastic member 5A is not in direct contact with the frame 4, vibratory energy is prevented from leaking into the frame 4 via the visco-elastic member 5A. Moreover, the visco-elastic member 5A in the above-mentioned v/d ratio range does not cause a decrease in the reproduced sound volume level (which would occur if the visco-elastic member 5A had too large a bottom face area to leave a substantial portion of the piezoelectric vibrator 3 for contributing to sound volume reproduction). As a result, the amplitudes of peaks and troughs in the reproduced sound volume-frequency characteristics due to resonance and counter-resonance are minimized, thereby realizing sufficiently flat reproduction characteristics.

Figure 7B:
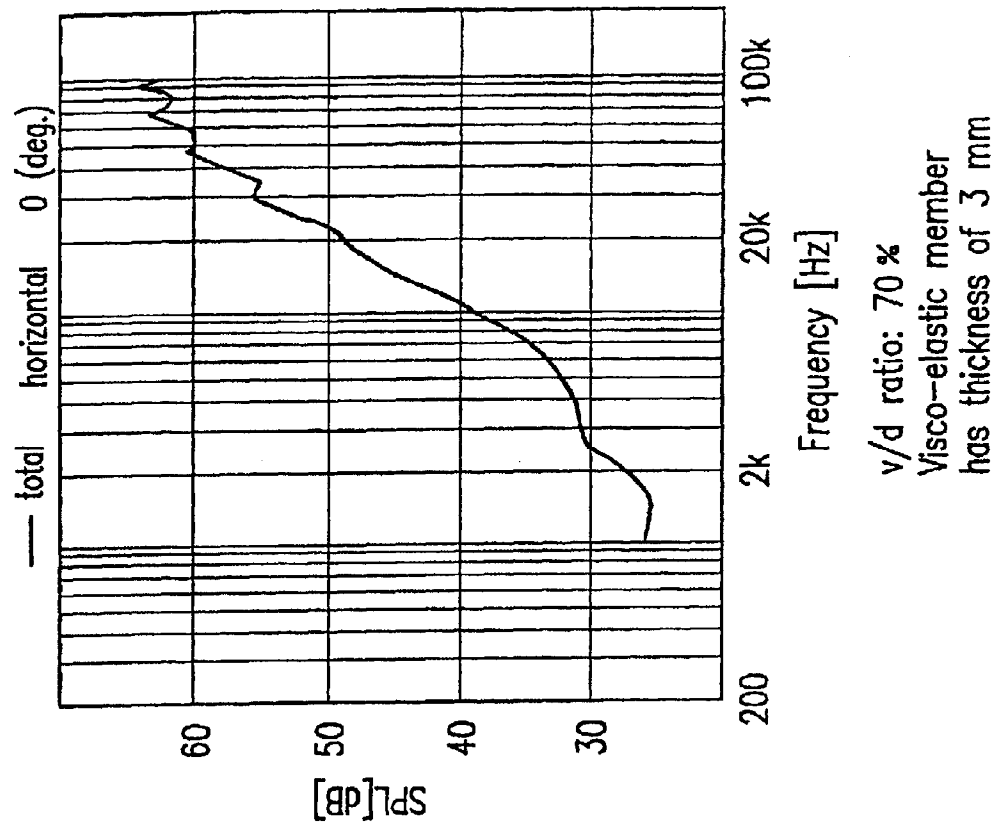
FIGS. 7A, 7B, and 7C are graphs illustrating the reproduced sound volume-frequency characteristics of a piezoelectric loudspeaker obtained by using visco-elastic members having various thicknesses.
Figure 7A:
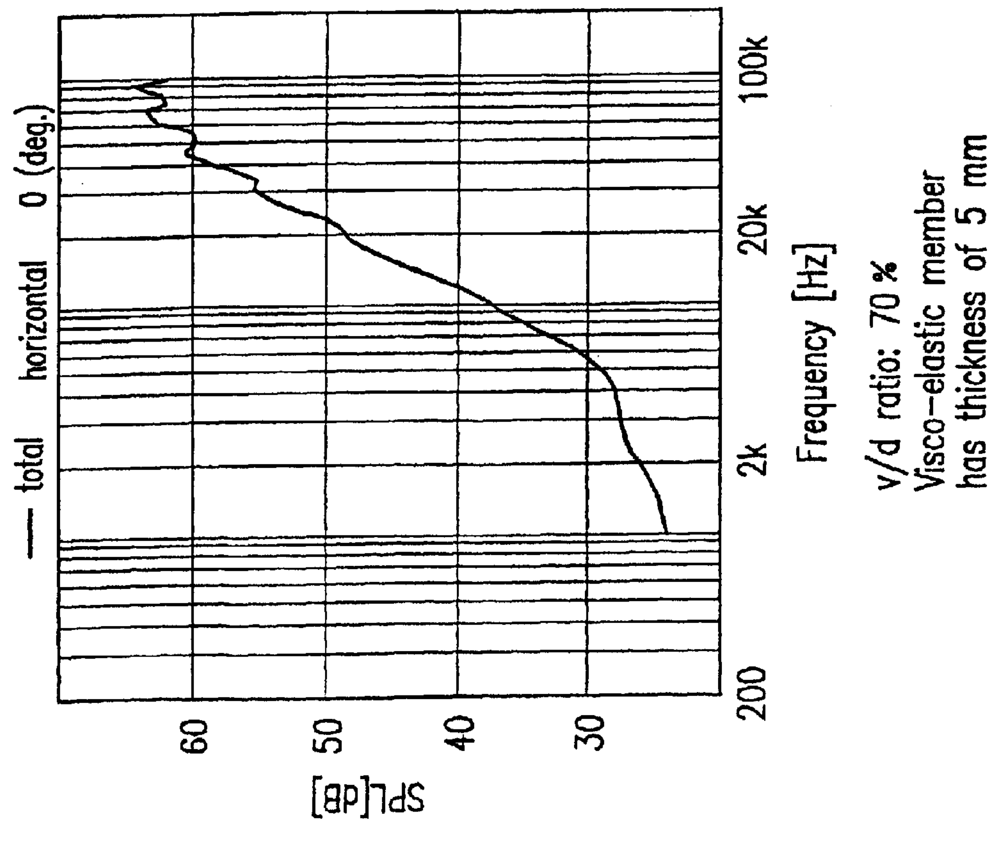
Figure 7C:
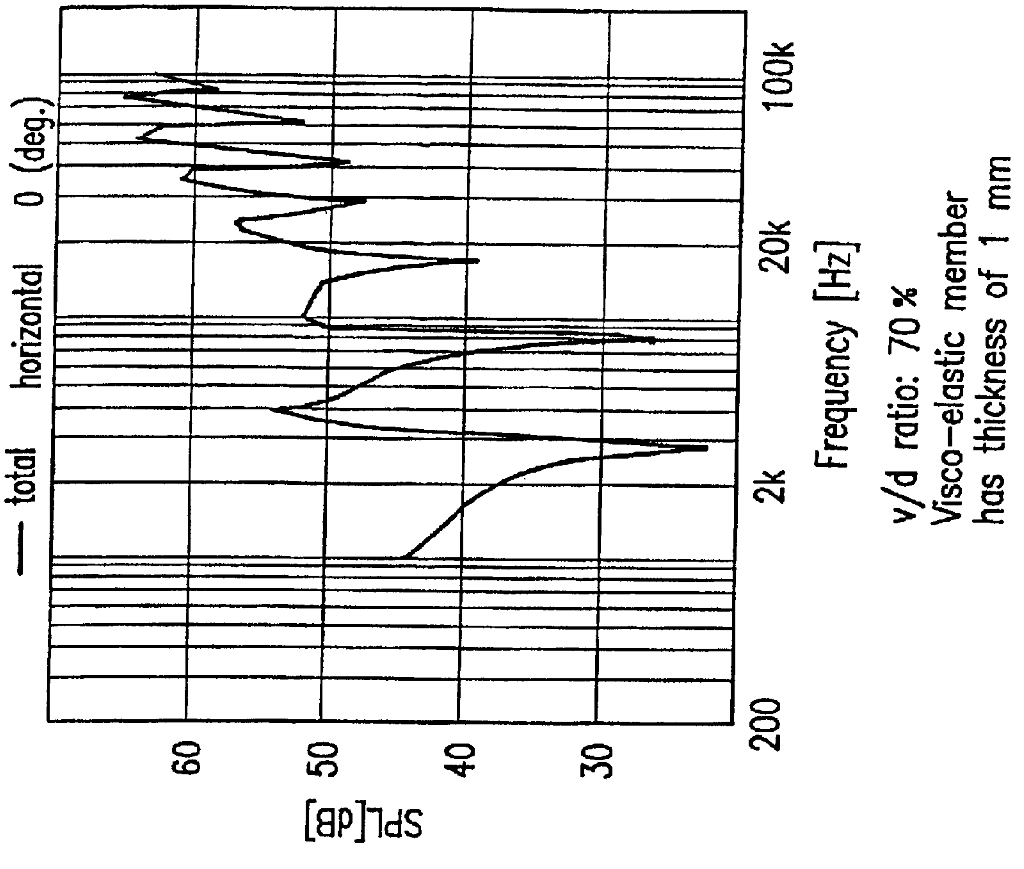

FIGS. 7A to 7C illustrate characteristics which are obtained by varying the thickness of the visco-elastic member 5A to be about 5 mm, about 3 mm, or about 1 mm with a fixed v/d ratio of about 70%. Thus, it is also possible to vary not only the bottom face area but also the height and/or shape of the visco-elastic member 5A in order to obtain the desired characteristics.

EXAMPLE 2

Figure 8:
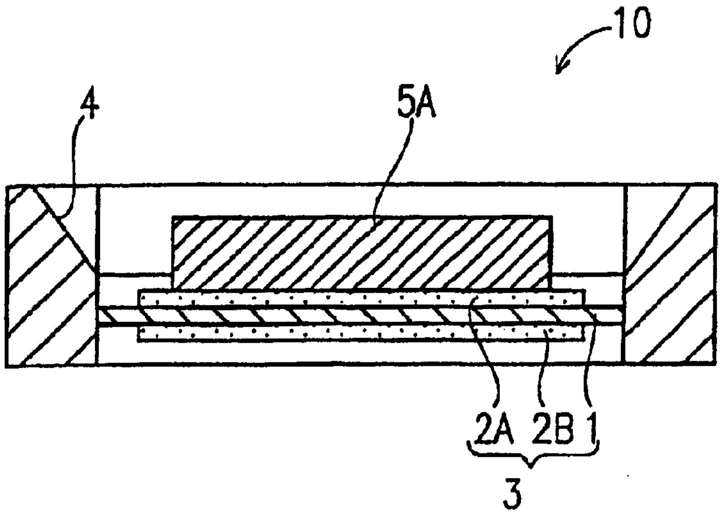
FIG. 8 is a cross-sectional view showing a piezoelectric loudspeaker according to Example 2 of the present invention.

FIG. 8 is a cross-sectional view showing a piezoelectric loudspeaker 10 according to Example 2 of the present invention. As shown in FIG. 8, the piezoelectric loudspeaker 10 includes a diaphragm 1, thin piezoelectric members 2A and 2B, a frame 4, and a visco-elastic member SA. A piezoelectric vibrator 3 of a bimorph type is composed of the diaphragm 1 and the thin piezoelectric members 2A and 2B attached to opposite sides thereof. The visco-elastic member 5A is attached to at least one side of the piezoelectric vibrator 3 so that the bottom face area of the visco-elastic member 5A accounts for about 11% to about 80% of the bottom face area of the diaphragm 1. As described with reference to Example 1, the piezoelectric loudspeaker 10 operates so as to prevent the occurrence of a plurality of resonance modes. Thus, flat sound volume-frequency characteristics can be attained.

EXAMPLE 3

Figure 9:
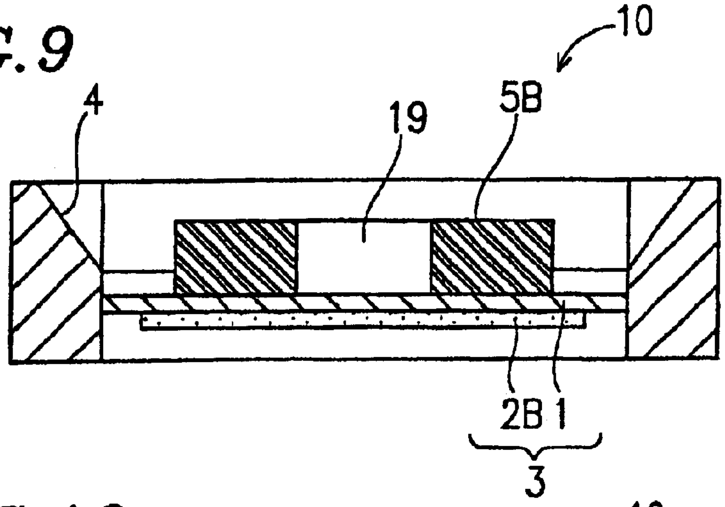
FIG. 9 is a cross-sectional view showing a piezoelectric loudspeaker according to Example 3 of the present invention.

FIG. 9 is a cross-sectional view showing a piezoelectric loudspeaker 10 according to Example 3 of the present invention. As shown in FIG. 9, the piezoelectric loudspeaker 10 includes a diaphragm 1, a thin piezoelectric member 2B, a frame 4, and a visco-elastic member 5B. The visco-elastic member 5B is a piece of visco-elastic material with a central aperture 19. Since the vibration mode varies depending on the sizes, densities, and Young's moduli of the diaphragm 1 and the thin piezoelectric member 2B, flat sound volume-frequency characteristics may be attained to more sufficient levels with the visco-elastic member 5B having the central aperture 19 than with a visco-elastic member (e.g., 5A shown in FIGS. 1 and 8) without a central aperture under some conditions, while also preventing a decrease in the sound volume level. Instead of having the illustrated aperture 19, the visco-elastic member 5B may simply have a configuration which becomes thinner toward the center for similar effects.

EXAMPLE 4

Figure 10:
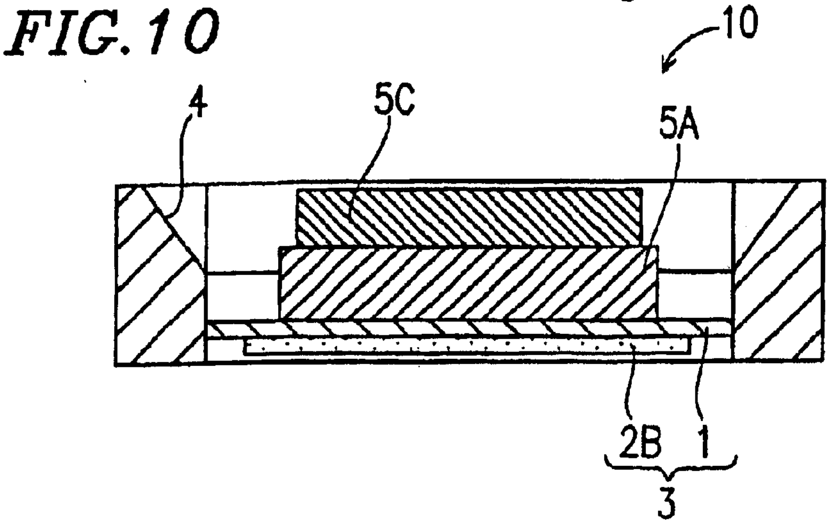
FIG. 10 is a cross-sectional view showing a piezoelectric loudspeaker according to Example 4 of the present invention.

FIG. 10 is a cross-sectional view showing a piezoelectric loudspeaker 10 according to Example 4 of the present invention. As shown in FIG. 10, the piezoelectric loudspeaker 10 includes a diaphragm 1, a thin piezoelectric member 2B, a frame 4, and visco-elastic members 5A and 5C. A piezoelectric vibrator 3 is composed of the diaphragm 1 and the thin piezoelectric member 2B attached thereto. The visco-elastic members 5A and 5C are attached to one side of the piezoelectric vibrator 3, with the visco-elastic member 5C being stacked on top of the visco-elastic member 5A, where the visco-elastic member 5A and 5C preferably are at least two different visco-elastic members having different sizes and/or being of different materials. Owing to the different densities, Young's moduli, and loss coefficients of the two visco-elastic members 5A and 5C and the piezoelectric vibrator 3, a complex vibratory system is constructed. As a result, the resonance modes of the piezoelectric vibrator 3 are further controlled for even flatter sound volume-frequency characteristics.

Although two layers of visco-elastic members 5A, 5B and 5C are shown in the present example, it is also applicable to employ three or more layers of such visco-elastic members for similar effects.

Although the illustrated visco-elastic members 5A, 5B, and 5C are attached to only one side of the piezoelectric vibrator 3 in FIGS. 1 and 8 to 10, they may alternatively be attached to opposite sides of the piezoelectric vibrator 3 for enhanced control of resonance modes.

EXAMPLE 5

Figure 11:
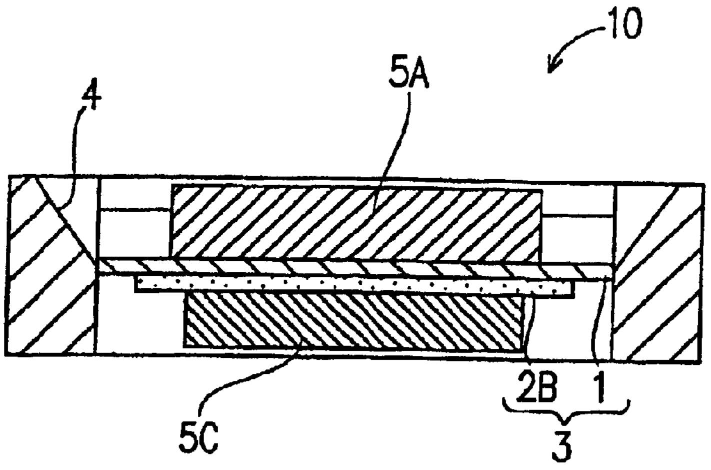
FIG. 11 is a cross-sectional view showing a piezoelectric loudspeaker according to Example 5 of the present invention.

FIG. 11 is a cross-sectional view showing a piezoelectric loudspeaker 10 according to Example 5 of the present invention. As shown in FIG. 11, the piezoelectric loudspeaker 10 includes a diaphragm 1, a thin piezoelectric member 2B, a frame 4, and visco-elastic members 5A and 5C. A piezoelectric vibrator 3 is composed of the diaphragm 1 and the thin piezoelectric member 2B attached thereto. The visco-elastic members 5A and 5C are attached to opposite sides of the piezoelectric vibrator 3, where the visco-elastic member 5A and SC preferably have different sizes and/or are of different materials. The piezoelectric vibrator 3, which would otherwise vibrate with a large vibration amplitude at the resonance points, has its resonance modes dispersed due to the visco-elastic members 5A and 5C attached to opposite sides thereof. Thus, the control over the resonance of the piezoelectric vibrator 3 is further enhanced. As a result, flat sound volume-frequency characteristics can be obtained with relatively small and/or thin visco-elastic members 5A and 5C.

EXAMPLE 6

Figure 12:
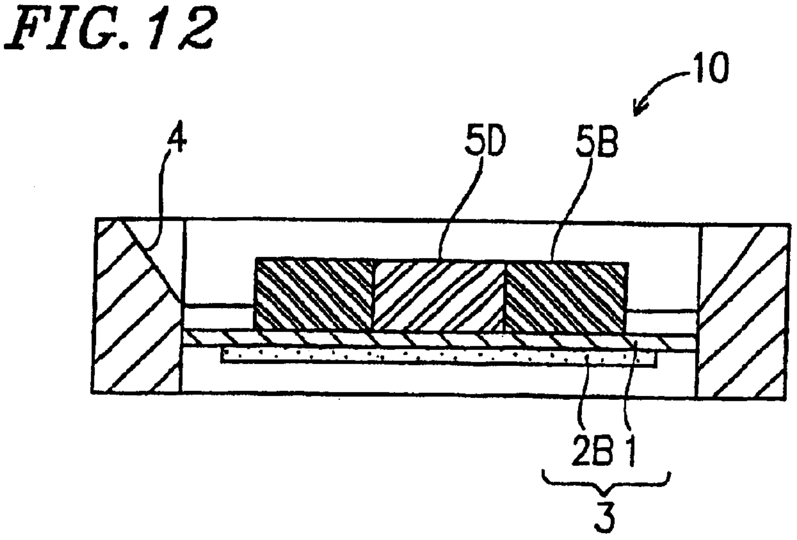
FIG. 12 is a cross-sectional view showing a piezoelectric loudspeaker according to Example 6 of the present invention.

FIG. 12 is a cross-sectional view showing a piezoelectric loudspeaker 10 according to Example 6 of the present invention. As shown in FIG. 12, the piezoelectric loudspeaker 10 includes a diaphragm 1, a thin piezoelectric member 2B, a frame 4, and visco-elastic members 5B and 5D. A piezoelectric vibrator 3 is composed of the diaphragm 1 and the thin piezoelectric member 2B attached thereto. The visco-elastic members 5B and 5D, which are configured in a circularly concentric manner, are attached to one side of the piezoelectric vibrator 3, where the central visco-elastic member 5D and the peripheral visco-elastic member 5B are preferably composed of different visco-elastic materials having different values of specific gravity, Young's moduli, and internal losses. The design of the piezoelectric loudspeaker 10 can be optimized by selecting different materials for the central portion (which undergoes relatively large displacement) and the peripheral portion (which undergoes a relatively small displacement). Although the visco-elastic member 5B and 5D are illustrated as two concentric circular members, three or more such members can be employed for similar effects.

EXAMPLE 7

Figure 13:
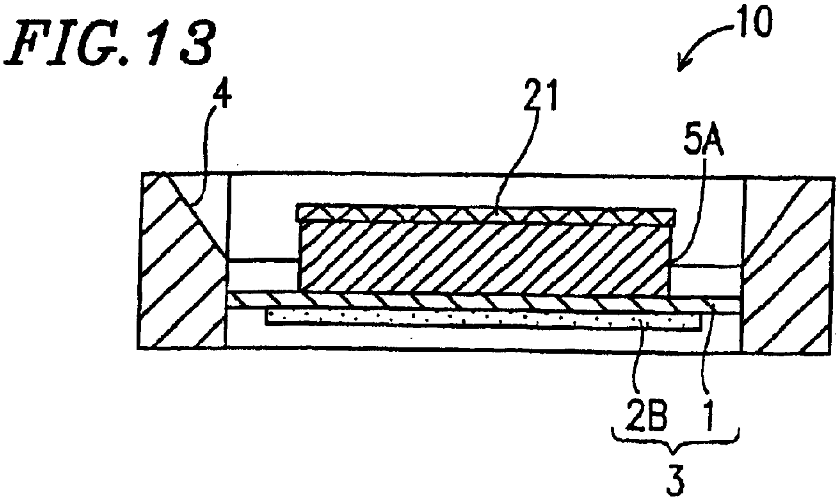
FIG. 13 is a cross-sectional view showing a piezoelectric loudspeaker according to Example 7 of the present invention.

FIG. 13 is a cross-sectional view showing a piezoelectric loudspeaker 10 according to Example 7 of the present invention. As shown in FIG. 13, the piezoelectric loudspeaker 10 includes a diaphragm 1, a thin piezoelectric member 28, a frame 4, a visco-elastic member SA, and a rigid member 21 (e.g., metal or alloy) which is heavier than the visco-elastic member 5A. A piezoelectric vibrator 3 is composed of the diaphragm 1 and the thin piezoelectric member 2B attached thereto. The visco-elastic member 5A is attached to one side of the piezoelectric vibrator 3, and the rigid member 21 is attached to a side of the visco-elastic member 5A not facing the piezoelectric vibrator 3. The visco-elastic member 5A having the aforementioned rigid member 21 attached thereto generates its own unique resonance at a lower frequency and causes the visco-elastic member 5A to vibrate with an increased amplitude. As a result, large visco-elastic effects are obtained even with a relatively small visco-elastic member 5A. Consequently, the visco-elastic member 5A according to the present example acts to control lower-order resonance modes of the piezoelectric vibrator 3, thereby attaining flat sound volume-frequency characteristics beginning at even lower frequency bands than those in the above-mentioned examples. Although not shown in FIGS. 12 and 13, the visco-elastic member 5A having the aforementioned rigid member 21 attached thereto may be attached to each side of the piezoelectric vibrator 3 for enhanced effects. A plurality of such visco-elastic members 5A may be stacked for similar effects.

EXAMPLE 8

Figure 14A:
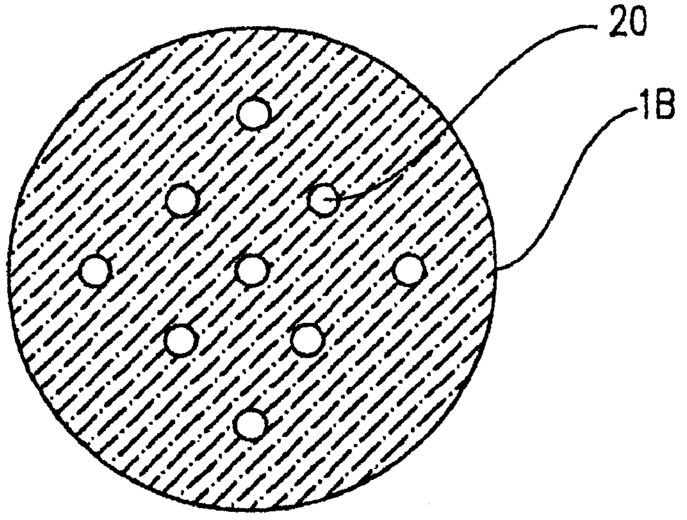
FIG. 14A is a plan view showing a diaphragm of a piezoelectric loudspeaker according to Example 8 of the present invention.
Figure 14B:
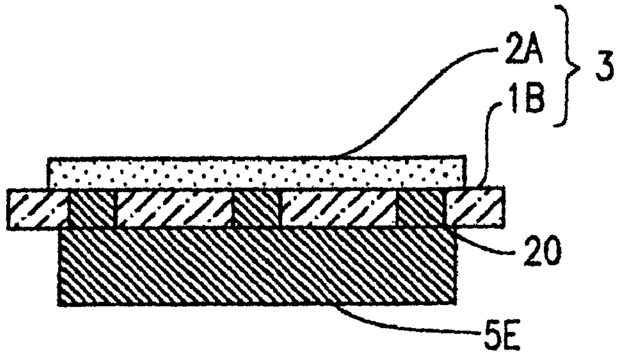
FIG. 14B is a cross-sectional view showing a piezoelectric vibrator in a piezoelectric loudspeaker according to Example 8 of the present invention, the piezoelectric vibrator having a visco-elastic member attached thereto.

FIG. 14A is a plan view showing a diaphragm 1B of a piezoelectric loudspeaker according to Example 8 of the present invention. FIG. 14B is a cross-sectional view showing a piezoelectric vibrator 3 of the piezoelectric loudspeaker 10 according to the present example, with visco-elastic member 5E provided thereon. As shown in FIGS. 14A and 14B, the piezoelectric loudspeaker 10 includes the diaphragm 1B having apertures 20 provided therein, a thin piezoelectric member 2A, and a visco-elastic member 5E. The outer periphery of the diaphragm 1B is affixed to or supported by a frame (not shown) in a manner similar to that shown in FIG. 1. The visco-elastic member 5E partially fills the apertures 20 of the diaphragm 1B. This structure enhances the control over the resonance of the diaphragm 1B of the piezoelectric vibrator 3, thereby providing flat reproduced sound volume-frequency characteristics.

EXAMPLE 9

Figure 15:
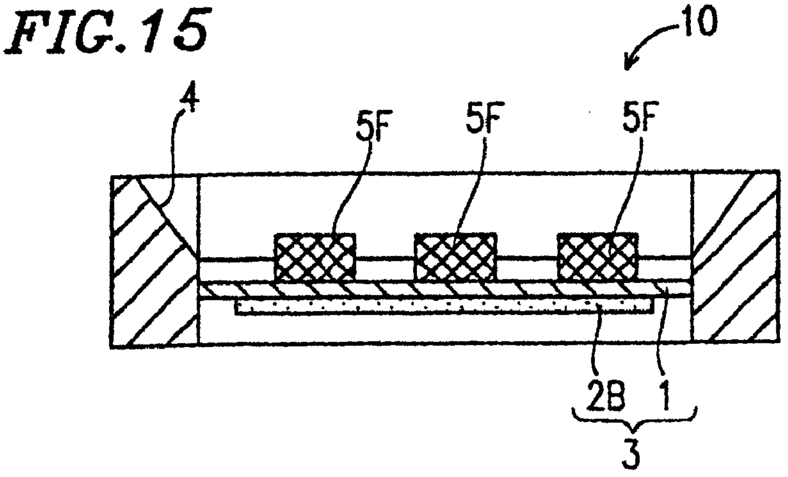
FIG. 15 is a cross-sectional view showing a piezoelectric loudspeaker according to Example 9 of the present invention.

FIG. 15 is a cross-sectional view showing, a piezoelectric loudspeaker 10 according to Example 9 of the present invention. As shown in FIG. 15, the piezoelectric loudspeaker 10 includes a diaphragm 1, a thin piezoelectric member 2B, a frame 4, and a plurality of visco-elastic members 5F. A piezoelectric vibrator 3 is composed of the diaphragm 1 and the thin piezoelectric member 2B attached thereto. The visco-elastic members 5F are attached to one side of the piezoelectric vibrator 3 so as to be located on the diaphragm 1 or on the thin piezoelectric member 2B. The visco-elastic members 5F may be in contact with one another, or alternatively spaced apart from one another as desired. Preferably, the visco-elastic members 5F have mutually different values in at least one of specific gravity, Young's modulus, and internal loss. The design of the piezoelectric loudspeaker 10 in FIG. 15 can be optimized by varying the materials and/or shapes of the plurality of visco-elastic members 5F as desired for portions of the piezoelectric vibrator 3 which undergo relatively large displacement and portions of the piezoelectric vibrator 3 which undergo a relatively small displacement. Although three visco-elastic member 5F are illustrated in FIG. 15, two or more such members-can be suitably employed for similar effects.

EXAMPLE 10

Figure 16:
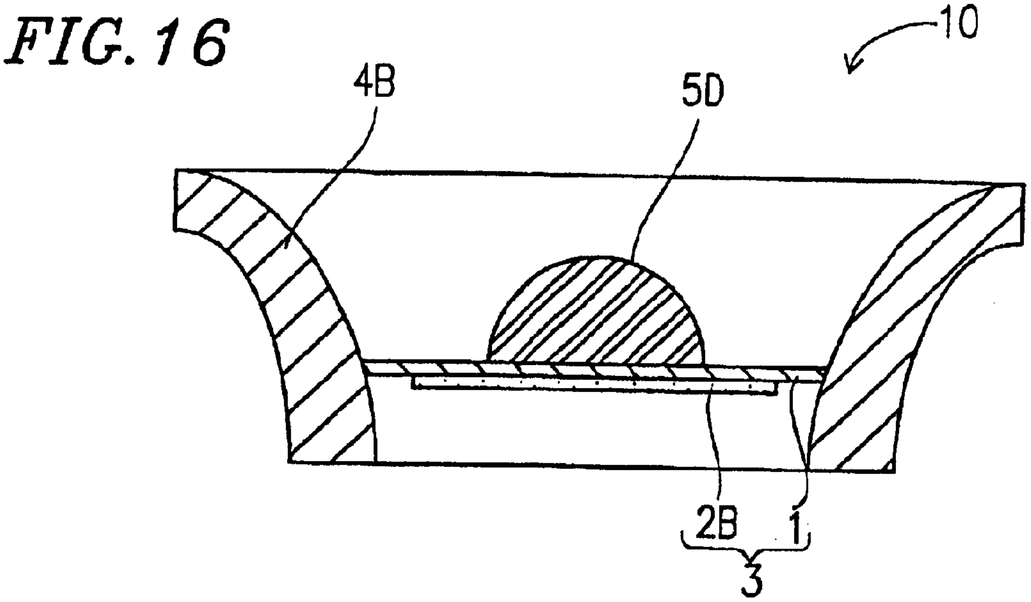
FIG. 16 is a cross-sectional view showing a piezoelectric loudspeaker with a horn structure according to Example 10 of the present invention.

FIG. 16 is a cross-sectional view showing a piezoelectric loudspeaker 10 according to Example 10 of the present invention. As shown in FIG. 16, the piezoelectric loudspeaker 10 includes a diaphragm 1, a thin piezoelectric member 2B, a frame 4B, and a visco-elastic member 5D. A piezoelectric vibrator 3 is composed of the diaphragm 1 and the thin piezoelectric member 2B attached thereto. As shown, the frame 4B used to affix or support the piezoelectric vibrator 3 has a horn-like configuration such that its opening has gradually increasing cross-sectional area (taken along a direction perpendicular to the plane of FIG. 16) away from the diaphragm 1 and toward the final opening (shown at the uppermost portion of FIG. 16). The visco-elastic member 5D has a conical configuration which has largest cross-sectional area where it is in contact with the piezoelectric vibrator 3 and gradually decreases in cross-sectional area away from the piezoelectric vibrator 3. The visco-elastic member 5D acts to control the resonance modes of the piezoelectric vibrator 3. Furthermore, the sound path formed by the visco-elastic member 5D and the opening of the frame 4B presents a horn-like configuration for enhancing the reproduced sound volume level due to known horn effects. An additional advantage of ability to control the directivity of sound reproduction by varying the horn configuration is also produced. The visco-elastic member 5D, which is located within the horn structure, serves as a phase equalizer, thereby realizing a loudspeaker having high reproduction efficiency up to the higher frequencies.

EXAMPLE 11

Figure 17:
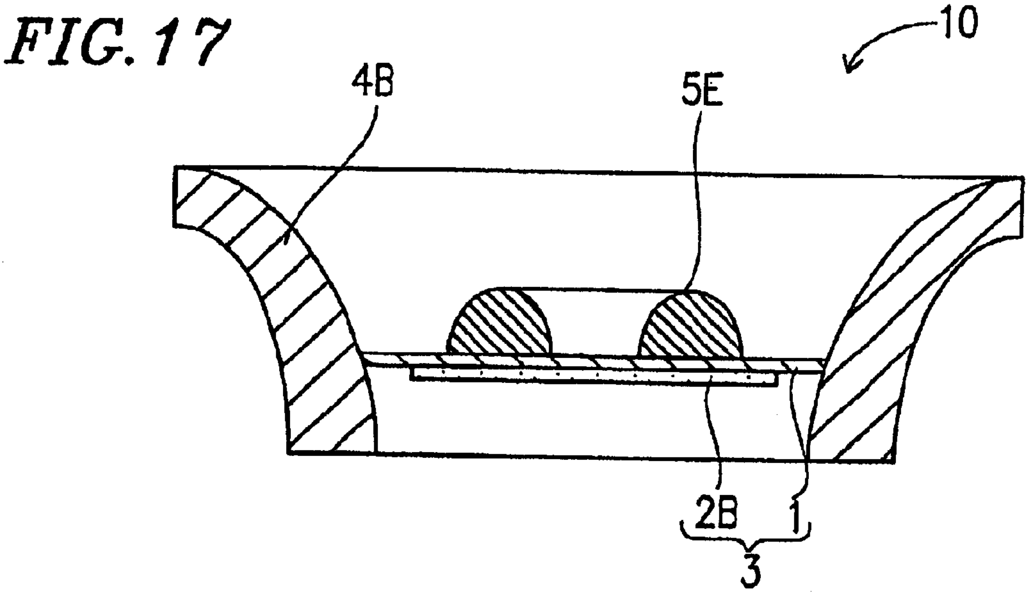
FIG. 17 is a cross-sectional view showing a piezoelectric loudspeaker with a horn structure according to Example 11 of the present invention.

FIG. 17 is a cross-sectional view showing a piezoelectric loudspeaker 10 according to Example 11 of the present invention. As shown in FIG. 17, the piezoelectric loudspeaker 10 includes a diaphragm 1, a thin piezoelectric member 2B, a frame 4B, and a visco-elastic member 5E. A piezoelectric vibrator 3 is composed of the diaphragm 1 and the thin piezoelectric member 2B attached thereto. As shown, the frame 4B for affixing or supporting the piezoelectric vibrator 3 has a horn-like configuration such that its opening has gradually increasing cross-sectional area (taken along a direction perpendicular to the plane of FIG. 17) away from the diaphragm 1 and toward the final opening (shown at the uppermost portion of FIG. 17). The visco-elastic member 5E has a central opening, and has a configuration which has largest cross-sectional area where it comes in contact with the piezoelectric vibrator 3 and gradually decreases in cross-sectional area away from the piezoelectric vibrator 3. Similar effects to those attained by Example 10 result from this configuration of the visco-elastic member 5E.

Although the visco-elastic members 5E, 5F, 5D, and 5E shown in FIGS. 14A, 14B, 15, 16, and 17 are illustrated as being attached to only one side of the respective piezoelectric vibrator 3, they may be attached to opposite sides of the respective piezoelectric vibrator 3 for enhanced resonance control.

In the following examples, it should be appreciated that each piezoelectric loudspeaker 10 shares the same basic structure as that described in the foregoing examples (e.g., the piezoelectric vibrator 3 being composed of a diaphragm and a thin piezoelectric member attached thereto). Accordingly, for conciseness, detailed description of such elements is omitted in the descriptions of the following examples.

EXAMPLE 12

Figure 18:
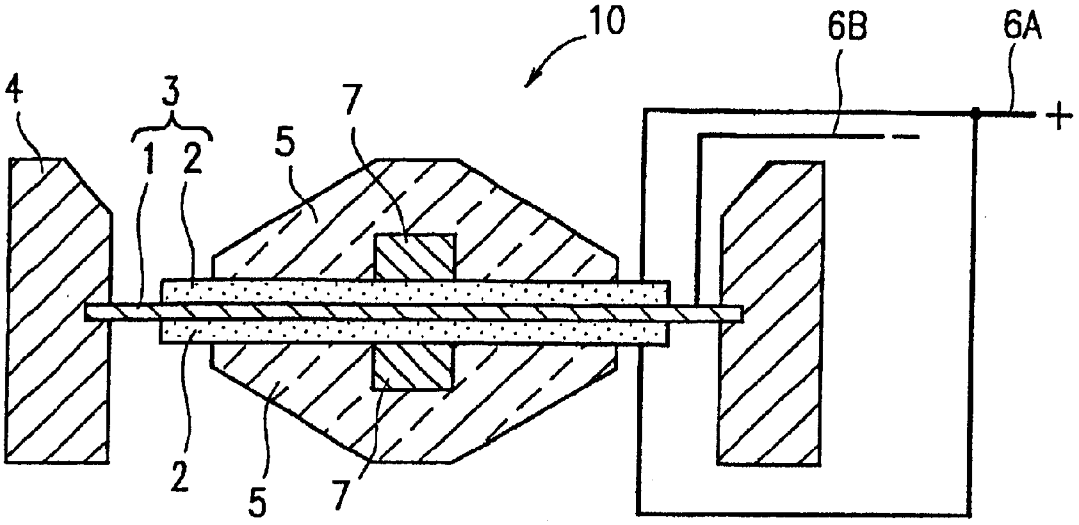
FIG. 18 is a cross-sectional view showing a piezoelectric loudspeaker according to Example 12 of the present invention.

FIG. 18 is a cross-sectional view showing a piezoelectric loudspeaker 10 according to Example 12 of the present invention. As shown in FIG. 18, the piezoelectric loudspeaker 10 includes elements 7, each of which is internalized within a visco-elastic member 5 and affixed to a piezoelectric vibrator 3. The elements 7 are composed essentially of a material such that at least one of the specific gravity and elastic modulus of the material is larger than the specific gravity and/or elastic modulus of the visco-elastic member 5.

The operation of the piezoelectric loudspeaker 10 according to the present example will now be described. As an electric input is applied across lead wires 6A and 6B, the piezoelectric vibrator 3 vibrates in a bending mode owing to the action of a piezoelectric member 2 attached to a diaphragm 1. Although the diaphragm 1 and the piezoelectric member 2 have very small internal losses and a large resonance peak Q at their respective resonance points, the visco-elastic members 5 which are attached to the piezoelectric vibrator 3 control its Q value. The piezoelectric vibrator 3 may have a large amplitude in the central portion even with the visco-elastic members 5 attached thereto, possibly causing the peeling of the piezoelectric member 2 from the diaphragm 1 during periods of excessive amplitude. Accordingly, the elements 7, at least one of whose specific gravity and elastic modulus is larger than the specific gravity and/or elastic modulus of the visco-elastic member 5, are used to control the amplitude.

In accordance with the above operation, the elements 7 serve to minimize the excessive amplitude occurring in the central portion of the piezoelectric vibrator 3 while maintaining flat reproduced sound volume-frequency characteristics provided by the damping effect of the visco-elastic members 5. As a result, the piezoelectric loudspeaker 10 attains an improved withstand input level without deterioration in the reproduced sound volume-frequency characteristics.

EXAMPLE 13

Figure 19A:
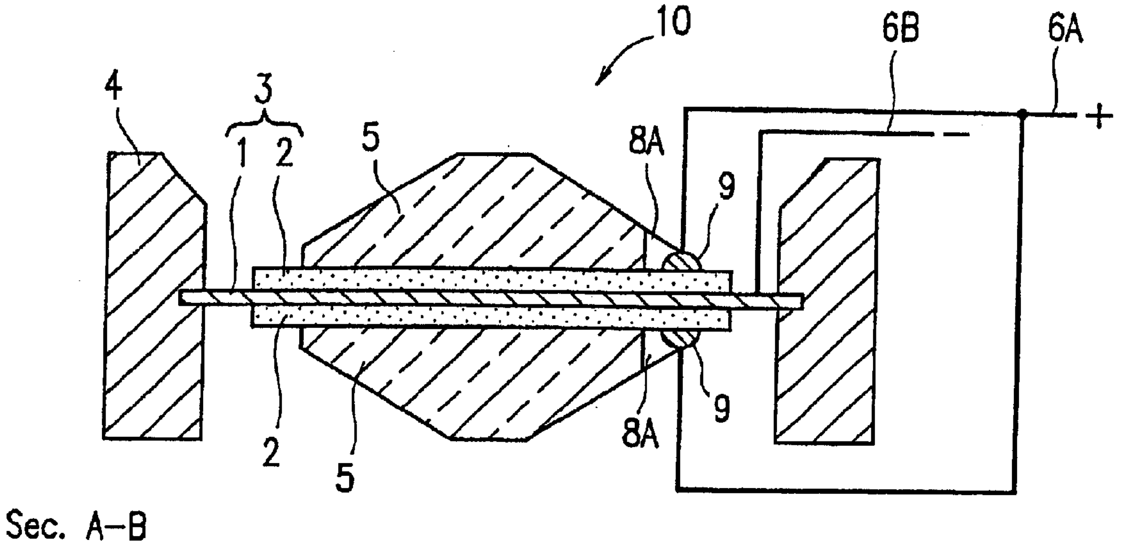
FIG. 19A is a cross-sectional view showing a piezoelectric loudspeaker according to Example 13 of the present invention.
Figure 19B:
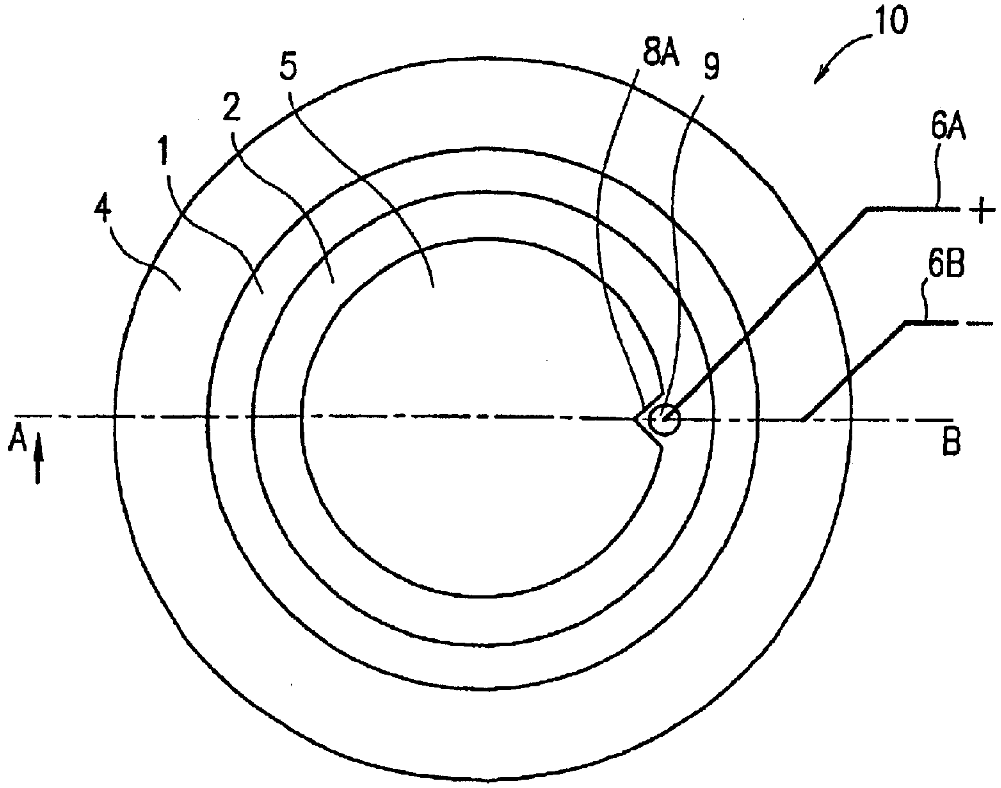
FIG. 19B is a plan view showing a piezoelectric loudspeaker according to Example 13 of the present invention.

FIGS. 19A and 19B are a cross-sectional view and a plan view, respectively, showing a piezoelectric loudspeaker 10 according to Example 13 of the present invention. As shown, each visco-elastic member 5 has a notch 8A so that a positive (+) lead wire can be coupled to a piezoelectric member 2 at a junction portion 9. Thus, the notch 8A is configured so that the junction portion 9 is not entirely covered over by the visco-elastic member 5.

The operation of the piezoelectric loudspeaker 10 according to the present example will now be described. When an electric input is applied across lead wires 6A and 6B, the piezoelectric vibrator 3 vibrates in a bending mode owing to the action of a piezoelectric member 2 attached to a diaphragm 1. Although the diaphragm 1 and the piezoelectric member 2 have very small internal losses and a large resonance peak Q at their respective resonance points, the visco-elastic members 5 which are attached to the piezoelectric vibrator 3 control its Q value. Although the positive lead wire 6A is typically coupled to the piezoelectric member 2 by use of solder or adhesive, which may form a bump at each junction portion 9 between the positive lead wire 6A and the piezoelectric member 2, the notches 5A allow the visco-elastic members 5 to be in close contact with the piezoelectric vibrator 3 in such a manner that the visco-elastic members 5 do not entirely cover the junction portions 9. As a result, the damping effect on the piezoelectric vibrator 3 provided by the visco-elastic members 5 can be fully realized, thereby providing stable, flat reproduced sound volume-frequency characteristics without substantial fluctuation.

Figure 20:
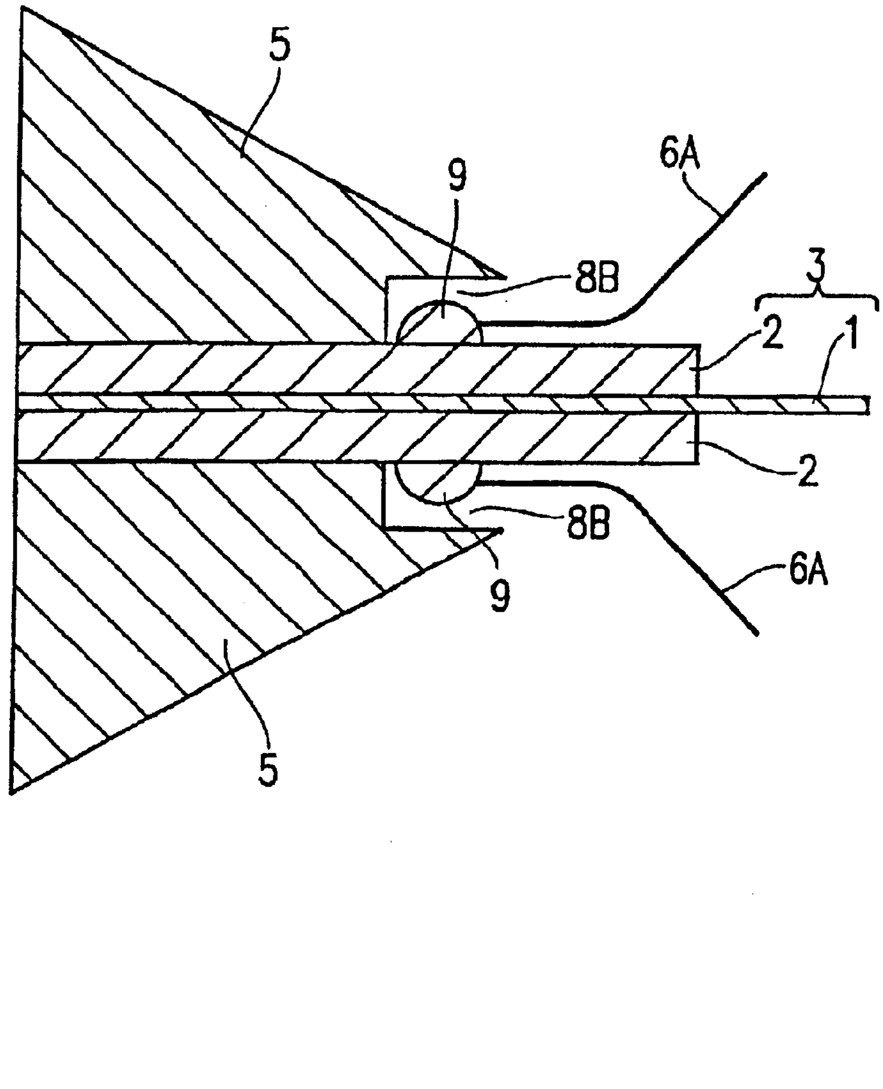
FIG. 20 is an enlarged partial cross-sectional view showing the vicinity of junction portions and notches in an alternative junction portion structure according to Example 13 of the present invention.
Figure 21:
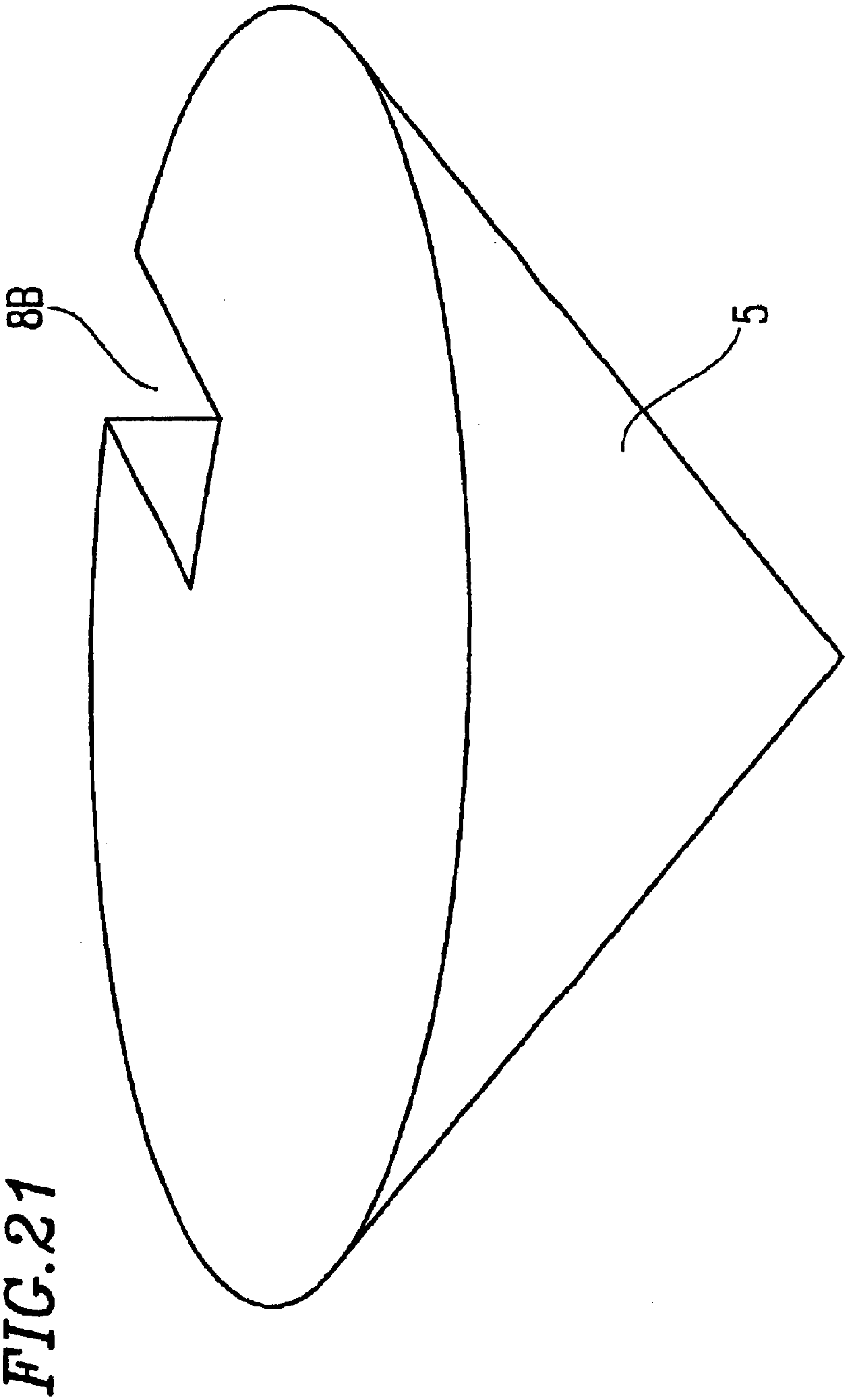
FIG. 21 is a lower perspective view showing a visco-elastic member in an alternative junction portion structure according to Example 13 of the present invention.

FIG. 20 is an enlarged partial cross-sectional view showing the vicinity of the junction portions 9 and the notches 5B in an alternative junction portion structure according to the present example. FIG. 21 is a perspective view showing the bottom face of each visco-elastic member 5, upon which the visco-elastic member 5 is attached to the piezoelectric member 2. As shown in FIGS. 20 and 21, the notches 8B may be configured so that the visco-elastic member 5 overhangs above the junction portion 9 for similar effects, whereby the appearance of the piezoelectric loudspeaker 10 can be improved.

The piezoelectric vibrators 3 shown in FIGS. 18, 19A, 19B, and 20 are of a bimorph type composed essentially of a diaphragm 1 and piezoelectric members 2 attached to opposite sides thereof. However, similar effects can be attained by employing. piezoelectric vibrators 3 of a monomorph type composed essentially of a diaphragm 1 and a piezoelectric member 2 attached to one side thereof.

EXAMPLE 14

Figure 22:
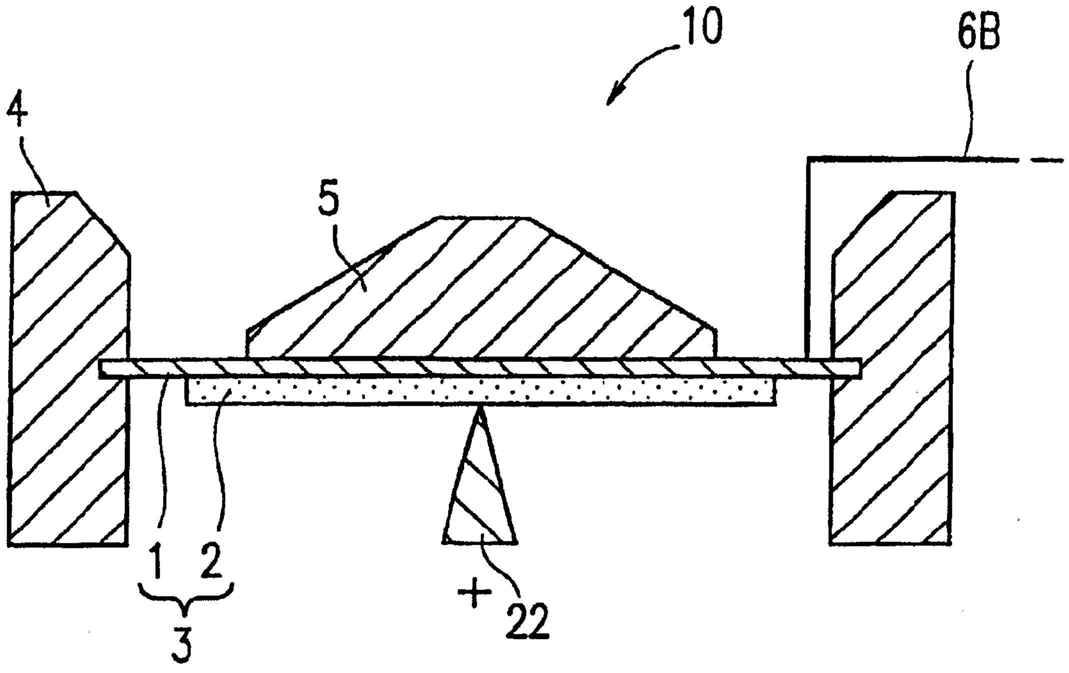
FIG. 22 is a cross-sectional view showing a piezoelectric loudspeaker according to Example 14 of the present invention.

FIG. 22 is a cross-sectional view showing a piezoelectric loudspeaker 10 according to Example 14 of the present invention. As shown, a support element 22 is provided at the substantial center of a piezoelectric vibrator 3. The support element 22 is at least partially composed of a conductive material, and also acts as a positive (+) electrode.

The operation of the piezoelectric loudspeaker 10 according to the present example will now be described. As an electric input is applied across the support element 22 and a negative (−) lead wire 6B, the input electric signal is transmitted to a piezoelectric member 2 via the partially conductive support element 22, causing the piezoelectric vibrator 3 to vibrate in a bending mode. A visco-elastic member 5 attached to the piezoelectric vibrator 3 controls the resonance peak Q at the resonance points of the piezoelectric vibrator 3, thereby providing flat reproduced sound volume-frequency characteristics.

The effects to be provided by the above-described operation will now be described. Since the support element 22 supports the piezoelectric vibrator 3 at its substantial center, the excessive amplitude which may occur in the central portion of the piezoelectric vibrator 3 responsive to a large electric input is minimized, thereby improving the withstand input level, this effect is similar to that provided by Example 13. In addition, according to the present example, since the conductive support element 22 doubles as a positive electrode for the piezoelectric vibrator 3, there is no need for a separate positive lead wire. As a result, the malfunctioning possibilities due to severance or entanglement of lead wires are minimized. The omission of a separate positive lead wire also makes for improved production yield and improved appearances.

Although the visco-elastic member 5 is shown in FIG. 22, the piezoelectric loudspeaker 10 according to Example 14 can also be implemented without a visco-elastic member 5 and still minimize the excessive amplitude occurring in the central portion of the piezoelectric vibrator 3. The support element 22,does not need to be conductive; in the case where the support element 22 is non-conductive, a positive lead wire will be provided.

EXAMPLE 15

Figure 23:
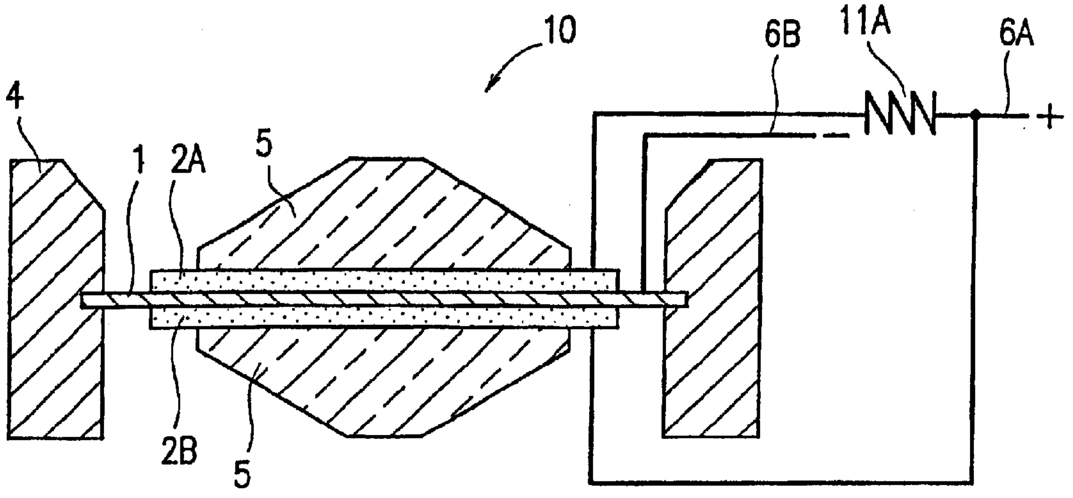
FIG. 23 is a cross-sectional view showing a piezoelectric loudspeaker according to Example 15 of the present invention.

FIG. 23 is a cross-sectional view showing a piezoelectric loudspeaker 10 according to Example 15 of the present invention. As shown in FIG. 23, piezoelectric member 2A and 2B are provided on an upper face and a lower face, respectively, of a diaphragm 1. An electrical resistance 11A is inserted between the piezoelectric member 2A and a positive (+) lead wire 6A.

Figure 24:
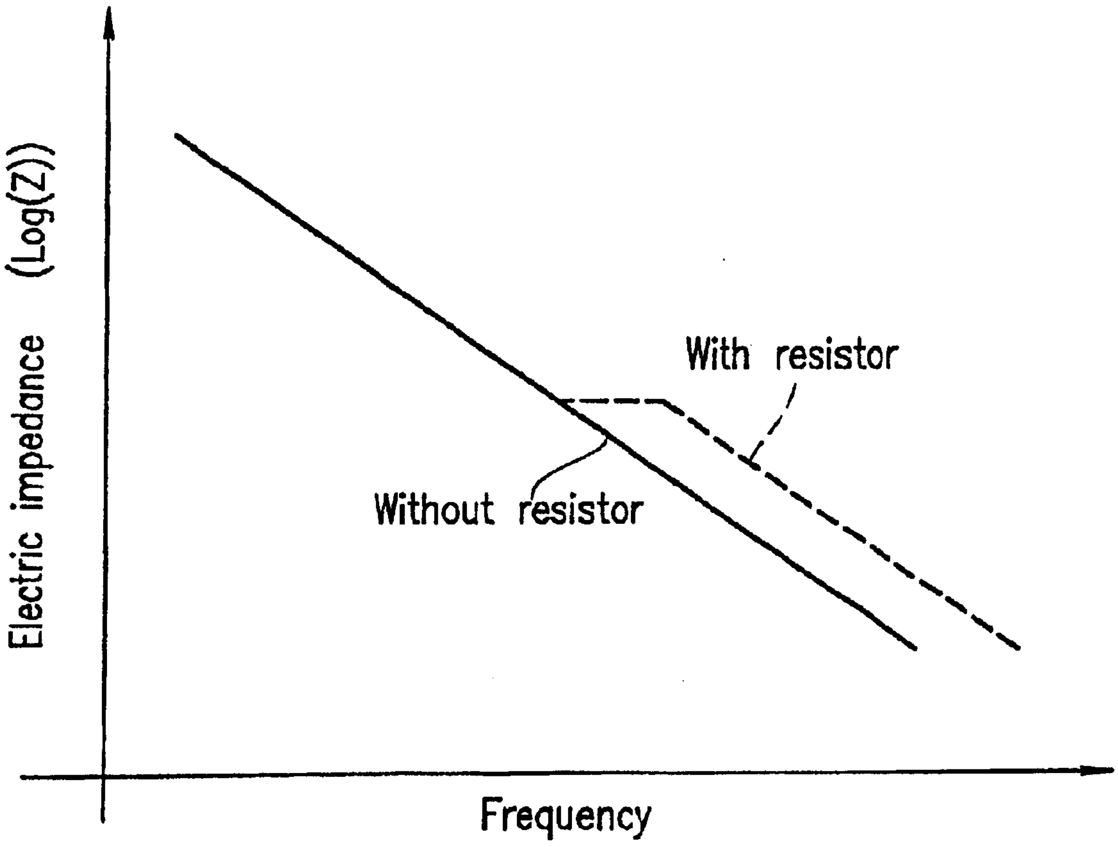
FIG. 24 is a graph illustrating electric impedance characteristics according to Example 15 of the present invention.
Figure 25:
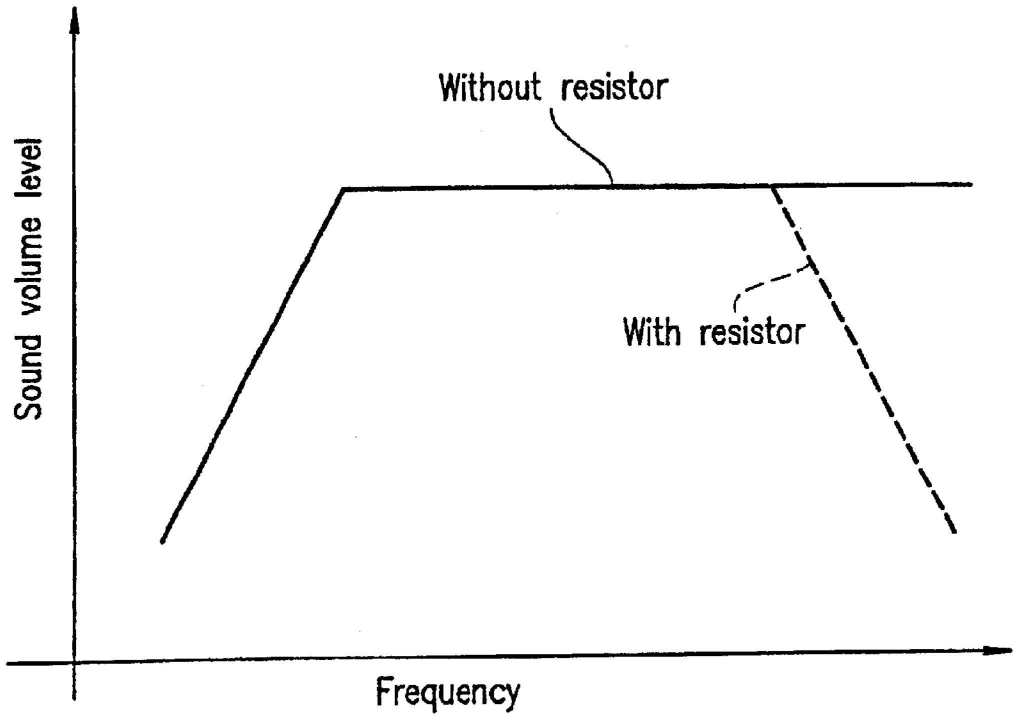
FIG. 25 is a graph illustrating sound volume characteristics according to Example 15 of the present invention.

The operation of the piezoelectric loudspeaker 10 according to the present example will now be described. As shown in the graph of FIG. 24, due to the electrical resistance 11L inserted between the piezoelectric member 2A and the positive lead wire 6A, the electrical impedance of the piezoelectric loudspeaker 10 as seen from the lead wires 6A and 6B is shifted upward in the higher frequency band as compared to that of the same piezoelectric loudspeaker 10 which lacks the electrical resistance 11A. When an electric input is applied to the lead wires 6A and 6B, the electric impedance characteristics as shown in FIG. 24 cause a corresponding decrease in the electric current flowing through the piezoelectric vibrator 3 in the higher frequency band as compared to that of the same piezoelectric loudspeaker 10 which lacks the electrical resistance 11A. Therefore, it is possible to construct a low-pass filter by merely incorporating the electrical resistance 11A for changing the sound volume characteristics as shown in FIG. 25.

Although visco-elastic members 5 are illustrated in FIG. 23, the present example can also be implemented without visco-elastic members 5.

EXAMPLE 16

Figure 26:
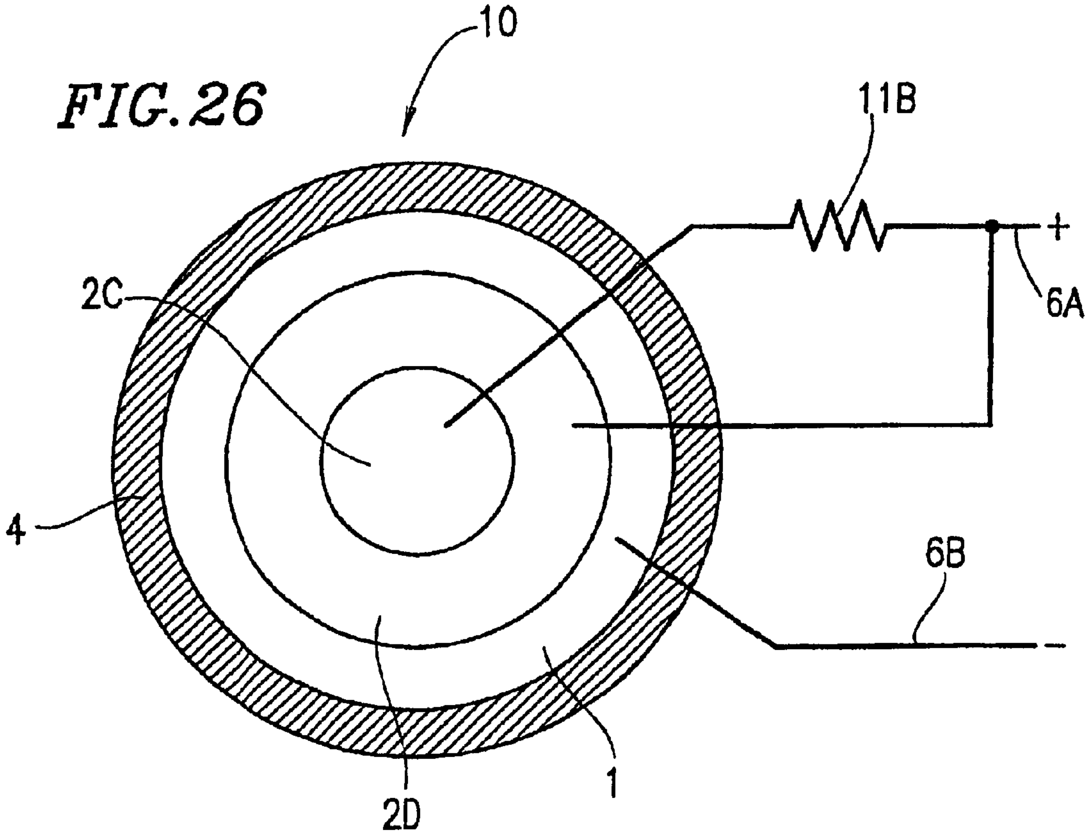
FIG. 26 is a cross-sectional view showing a piezoelectric loudspeaker according to Example 16 of the present invention.

FIG. 26 is a schematic plan view illustrating a piezoelectric loudspeaker 10 according to Example 16 of the present invention. The piezoelectric loudspeaker 10 includes a piezoelectric member 2 which is split in two sections 2C and 2D, with an electrical resistance 11B inserted between the piezoelectric section 2C and a positive lead wire 6A.

The operation of the above structure will now be described. As an electric input is applied to the lead wires 6A and 6B, a low pass filter is created which includes the electrical resistance 11B inserted between the piezoelectric section 2C and the positive lead wire 6A; this effect is similar to that provided by Example 15. The other piezoelectric section 2D operates as a normal piezoelectric loudspeaker (i.e., without low-pass filtering capabilities).

Figure 27:
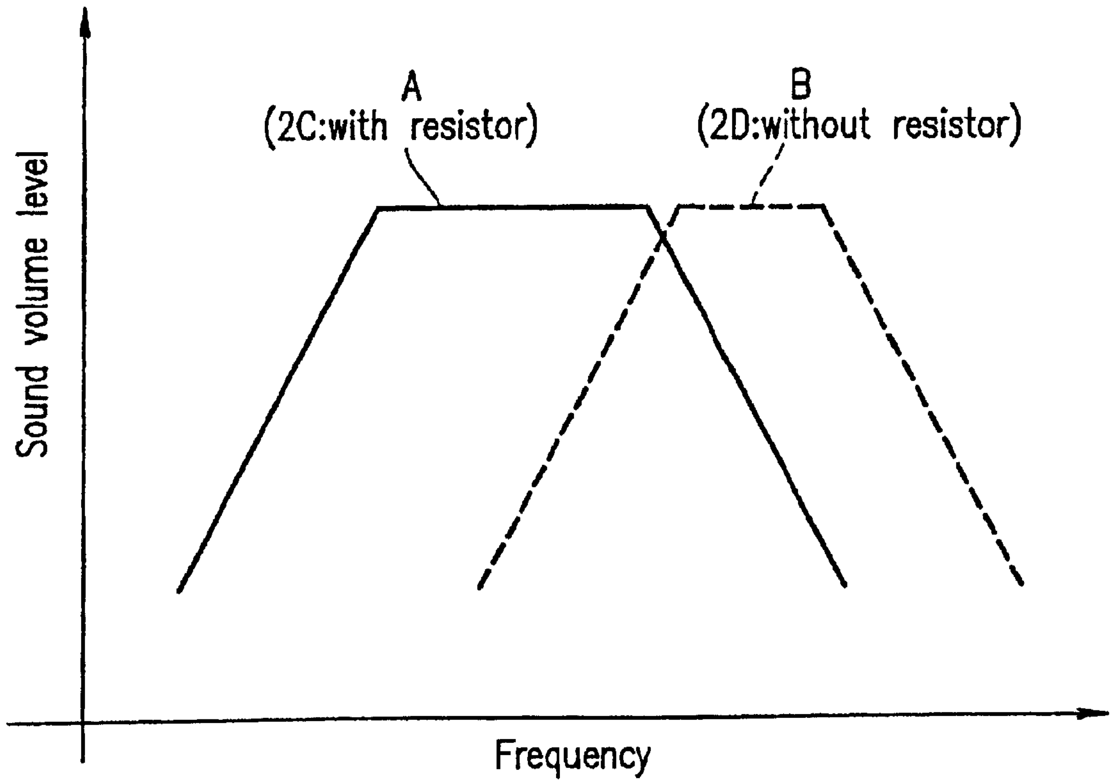
FIG. 27 is a graph illustrating sound volume characteristics of split sections of a piezoelectric vibrator according to Example 16 of the present invention.

It is possible to design the piezoelectric sections 2C and 2D so as to have different lowest reproducible frequencies by varying their areas and/or thicknesses. Therefore, the piezoelectric sections 2C and 2D may provide sound volume characteristics as exemplified by curves A and B, respectively, in the graph of FIG. 27. Accordingly, the overall characteristics of the piezoelectric loudspeaker 10 is equal to a sum of the characteristics A and B in FIG. 27. Thus, the reproducible frequency range of the piezoelectric loudspeaker 10 can be expanded.

Figure 28:
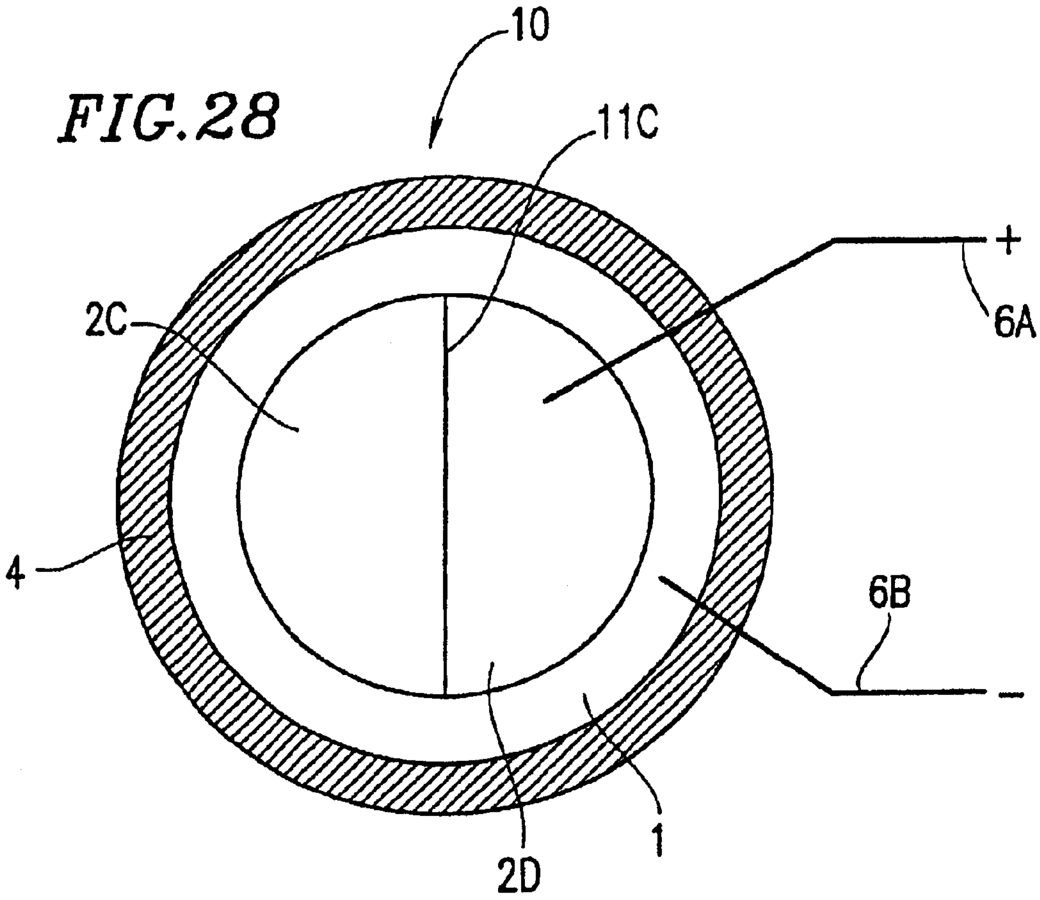
FIG. 28 is a cross-sectional view showing a piezoelectric loudspeaker according to Example 16 of the present invention.

By splitting the piezoelectric member 2 into right and left halves as shown in FIG. 28, and inserting a conductive material 11C between the two halves to serve as an electrical resistance between the piezoelectric sections 2C and 2D, similar effects to that obtained with the use of the electrical resistance 11B of FIG. 26 can be achieved.

Figure 29:
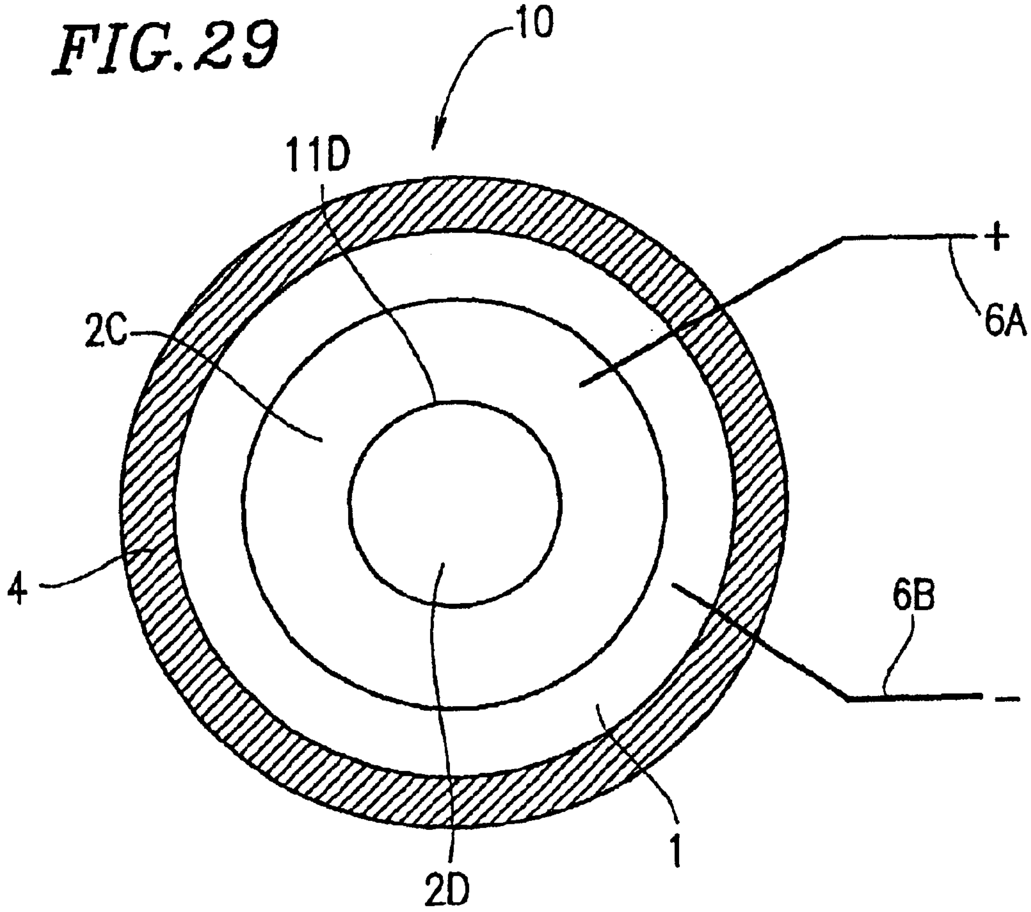
FIG. 29 is a cross-sectional view showing an alternative piezoelectric loudspeaker according to Example 16 of the present invention.

Similar effects can also be attained by splitting the piezoelectric member 2 into concentric sections 2C and 2D as shown in FIG. 29, and inserting a conductive material 11D to serve as an electrical resistance between the sections 2C and 2D.

Although FIGS. 26, 28, and 29 do not Illustrate any visco-elastic members, it is also applicable to provide a visco-elastic member 5 on the piezoelectric loudspeaker 10 according to Example 16 of the invention. The aforementioned piezoelectric member 2 composed of discrete piezoelectric sections may be implemented as a combination of annular piezoelectric members or stacked disk-shaped piezoelectric members. A plurality of electrical resistance elements, or a plurality of conductive elements to serve as electrical resistance, may be employed so long as they are capable of applying different voltages to the plurality of piezoelectric sections.

EXAMPLE 17

Figure 30:
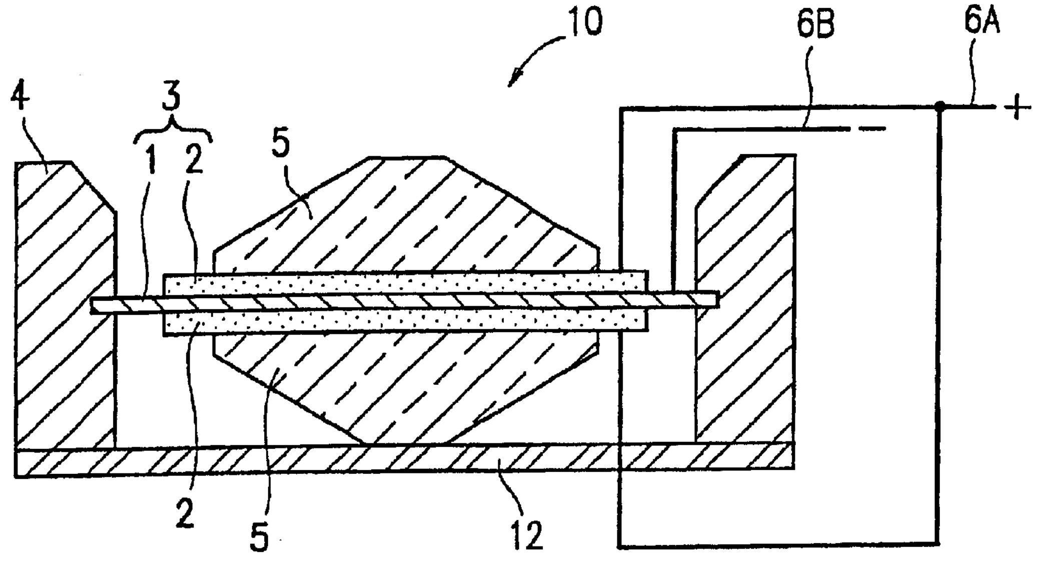
FIG. 30 is a cross-sectional view showing a piezoelectric loudspeaker according to Example 17 of the present invention.

FIG. 30 is a cross-sectional view showing a piezoelectric loudspeaker 10 according to Example 17 of the present invention. As shown, the piezoelectric loudspeaker 10 includes a plate 12 for interconnecting a frame 4 to one of a pair of visco-elastic members 5.

The operation of the piezoelectric loudspeaker 10 according to the present example will now be described. As an electric input is applied across lead wires 6A and 6B, a piezoelectric vibrator 3 vibrates in a bending mode. Although a diaphragm 1 and a piezoelectric member 2 have very small internal losses and a large resonance peak Q at their respective resonance points, the visco-elastic members 5 which are attached to the piezoelectric vibrator 3 control its Q value. Furthermore, since one of the visco-elastic members 5 is connected to the frame 4 via the plate 12, the central portion of the piezoelectric vibrator 3 (at which the piezoelectric vibrator 3 may be adhered to the visco-elastic member 5) is prevented from having an excessive amplitude.

In accordance with the operation, the plate 12 for interconnecting one of the visco-elastic members 5 to frame 4 serves to minimize the excessive amplitude occurring in the central portion of the piezoelectric vibrator 3 while maintaining flat reproduced sound volume-frequency characteristics due to the damping effect provided by the visco-elastic members 5. As a result, the piezoelectric loudspeaker 10 attains an improved withstand input level. Since an enclosed space can be formed between the plate 12, the frame 4, the diaphragm 1, and the visco-elastic member 5, there is provided a further advantage when constructing a speaker system by mounting the above piezoelectric loudspeaker 10 in a cabinet: that is, the diaphragm 1 is prevented from being strained due to unwanted vibration of the diaphragm 1 which is associated with the internal sound volume within the cabinet. Thus, a low-strain speaker system can be realized. Moreover, the physical volume within the enclosed space serves an "air spring" against the piezoelectric vibrator 3. The lowest resonance frequency of a given loudspeaker, which defines the lowest reproducible frequency of the loudspeaker, is determined by the mass of a diaphragm 1 and a spring factor against the diaphragm. Therefore, it is possible to adjust the lowest resonance frequency of the piezoelectric loudspeaker 10 by employing the physical volume within the enclosed space as a parameter in the loudspeaker design.

Figure 31:
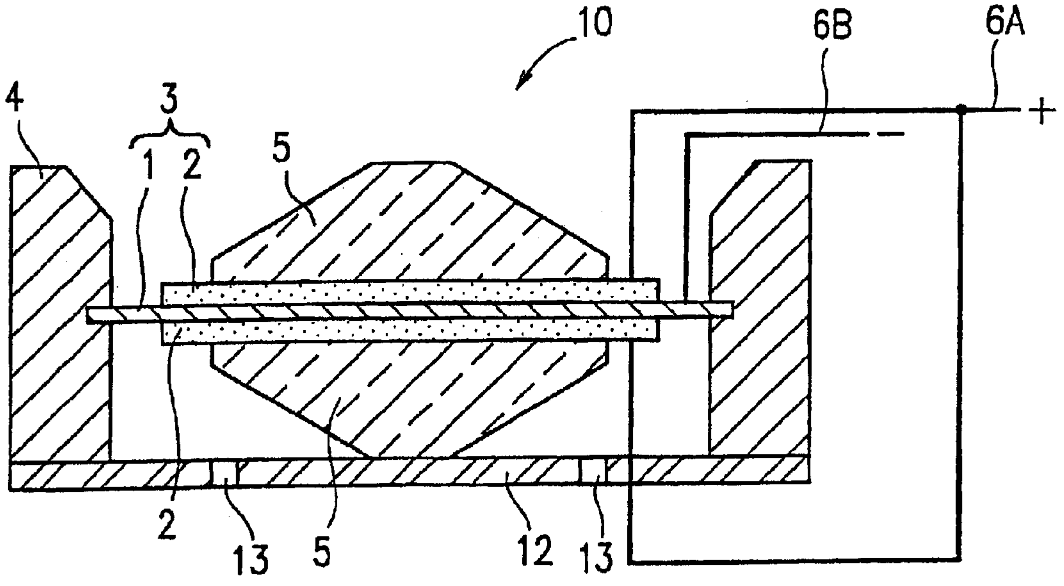
FIG. 31 Is a cross-sectional view showing an alternative piezoelectric loudspeaker according to Example 17 of the present invention.

It is also possible to provide through-holes 13 in the plate 12 for allowing air passage, as shown in FIG. 31. In this case, the through-holes 13 act as acoustic resistance against the piezoelectric vibrator 3. Thus, such through-holes 13 may be utilized to enhance the damping effects beyond what is attained by the visco-elastic members 5, thereby improving the flatness of the sound volume characteristics. The plate 12 also serves as a means for protecting the piezoelectric vibrator 3 from extrinsic impacts or shocks, and/or preventing foreign articles from straying into the speaker system.

Figure 32:
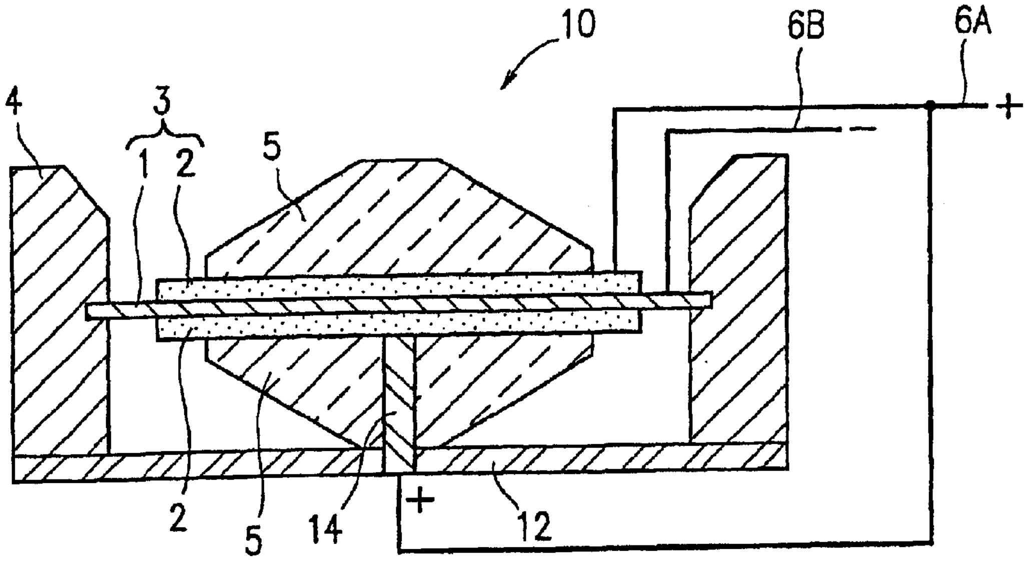
FIG. 32 is a cross-sectional view showing an alternative piezoelectric loudspeaker according to Example 17 of the present invention.

As shown in FIG. 32, it is also possible to provide an electrode 14 which is affixed to the plate 12 and penetrates the visco-elastic member 5 so as to achieve electrical contact with the piezoelectric vibrator 3, the electrode 14 serving as an electric input terminal. Since this eliminates the need for at least one lead wire, malfunctioning possibilities due to severance or entanglement of lead wires are minimized. A reduced number of lead wires also makes for improved production yield and improved appearances.

Figure 33:
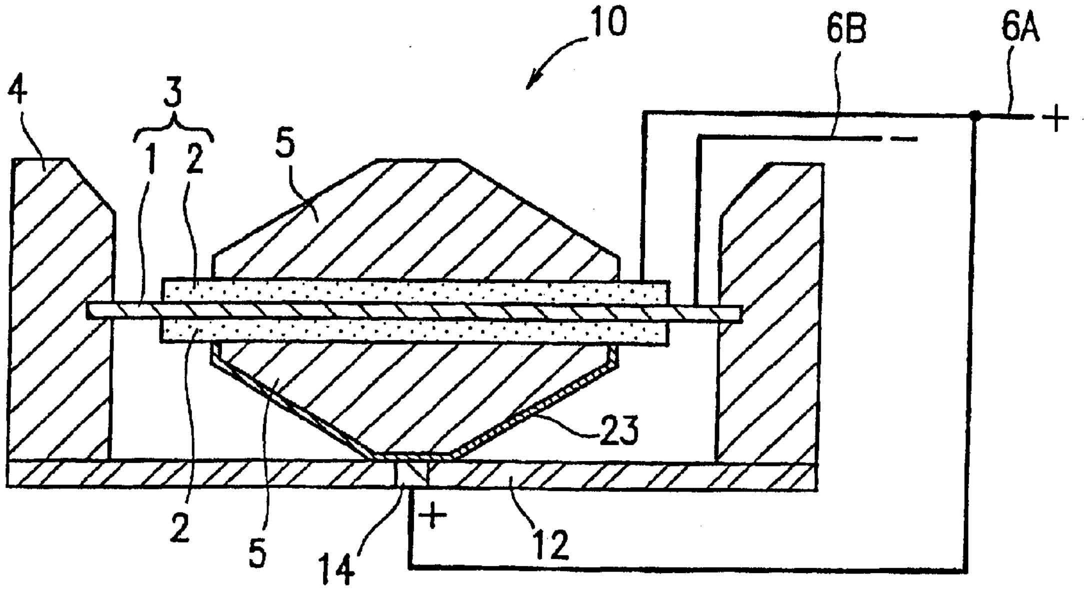
FIG. 33 is a cross-sectional view showing an alternative piezoelectric loudspeaker according to Example 17 of the present invention.

Similar effects can be obtained by coating a conductive material 23 on the surface of at least one of the visco-elastic members 5 or forming at least one of the visco-elastic members 5 from a conductive material, as shown in FIG. 33.

The piezoelectric vibrators 3 shown in FIGS. 30 to 33 are of a bimorph type composed essentially of a diaphragm 1 and piezoelectric members 2 attached to opposite sides thereof. However, similar effects can be attained by employing piezoelectric vibrators 3 of a monomorph type composed essentially of a diaphragm 1 and a piezoelectric member 2 attached to one side thereof; in this case, the positive lead wire 6A for the upper piezoelectric member 2 can be omitted, thereby making for much improved production yield and appearances. Although the above example illustrates two visco-elastic members 5 provided on opposite sides of the piezoelectric vibrator 3, it is also applicable to provide one visco-elastic member 5 on only one side of the piezoelectric vibrator 3.

EXAMPLE 18

Figure 34A:
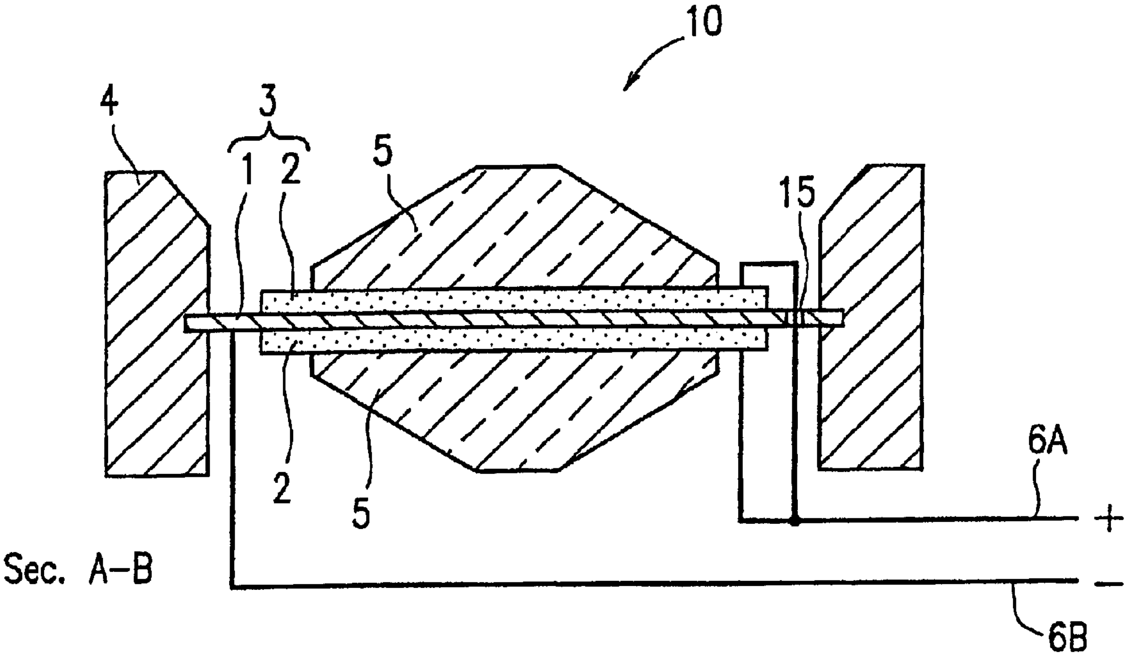
FIG. 34A is a cross-sectional view showing a piezoelectric loudspeaker according to Example 18 of the present invention.
Figure 34B:
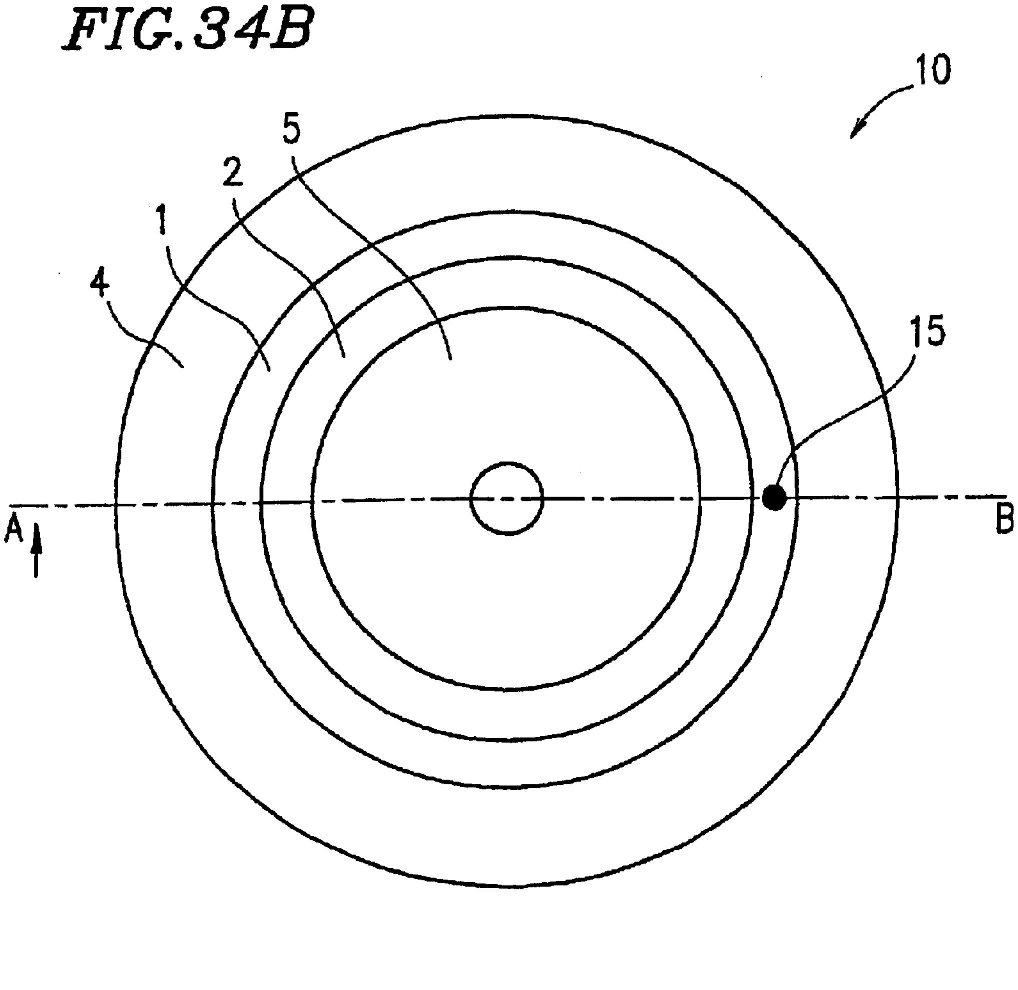
FIG. 34B is a plan view showing a piezoelectric loudspeaker according to Example 18 of the present invention.

FIGS. 34A and 34B are a cross-sectional view and a plan view, respectively, showing a piezoelectric loudspeaker 10 according to Example 18 of the present invention. As shown, a diaphragm 1 has a through-hole 15, through which one of positive (+) lead wires 6A is coupled to a piezoelectric vibrator 3. Thus, the lead wires can be gathered an the back side (shown as the lower side in FIG. 34A), which makes for improved appearances. Less complex wiring also leads to improved production yield.

EXAMPLE 19

Figure 35A:
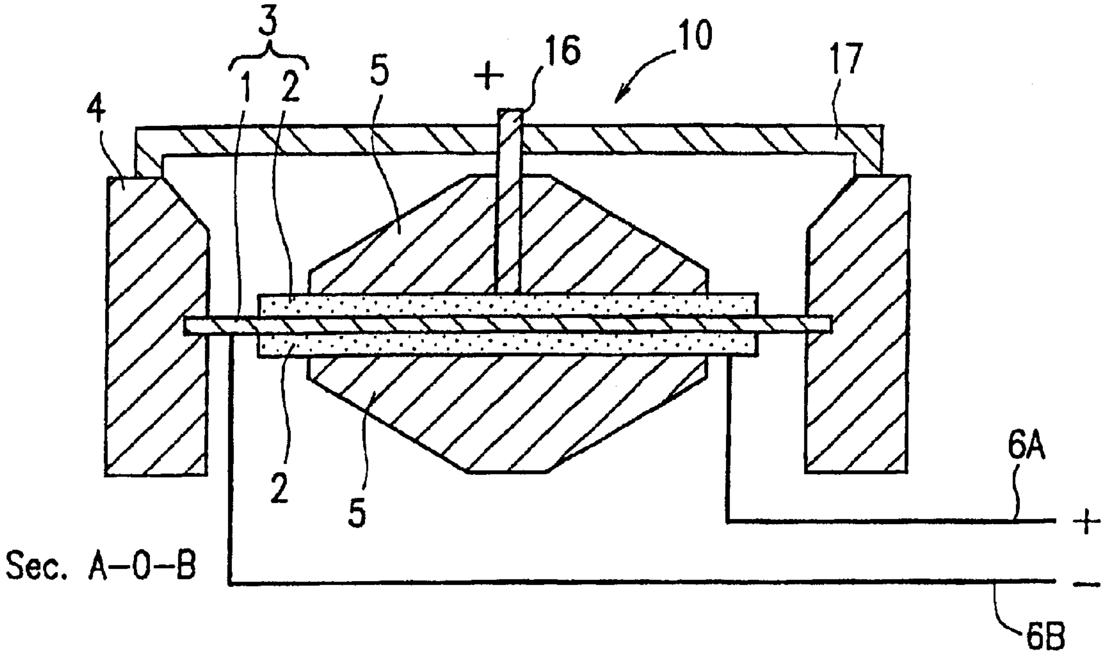
FIG. 35A is a cross-sectional view showing a piezoelectric loudspeaker according to Example 19 of the present invention.
Figure 35B:
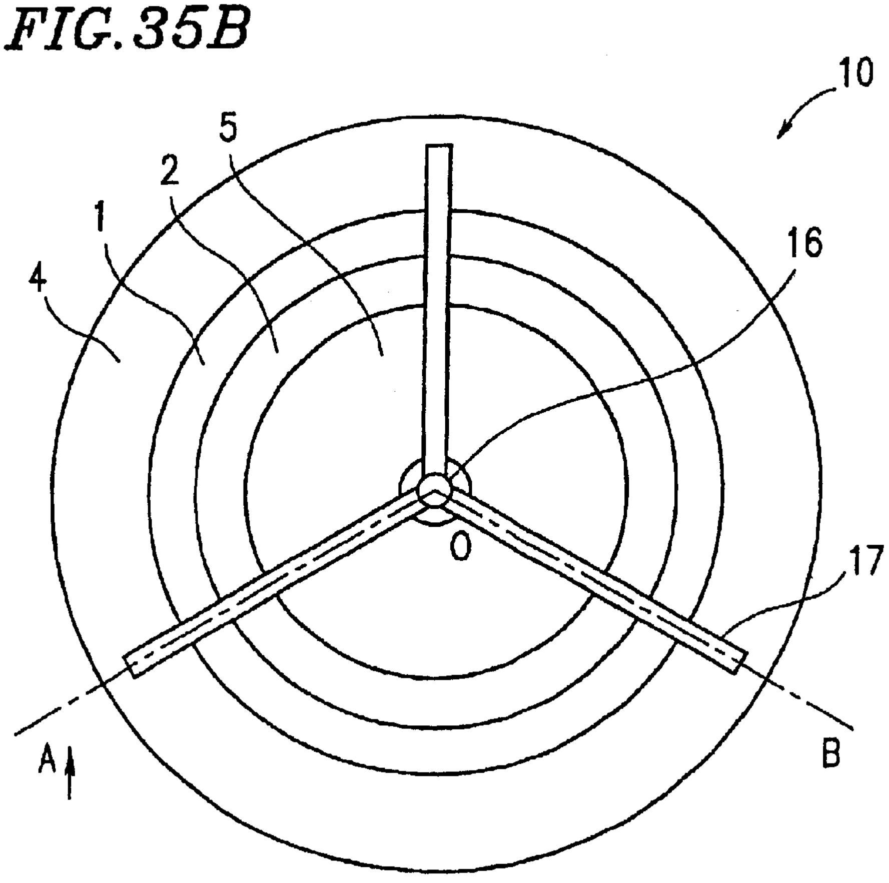
FIG. 35B is a plan view showing a piezoelectric loudspeaker according to Example 19 of the present invention.

FIGS. 35A and 35B are a cross-sectional view and a plan view, respectively, showing a piezoelectric loudspeaker 10 according to Example 19 of the present invention. As shown, a conductive electrode 16 is provided which is affixed to a frame 4 and penetrates the visco-elastic member 5 so as to achieve electrical contact with a piezoelectric vibrator 3. Moreover, a cover 17 is provided for connecting the electrode 16 to the frame 4.

Since the electrode 16 eliminates the need for at least one of the positive lead wires, malfunctioning possibilities due to severance or entanglement of lead wires are minimized. The cover 17 serves as a means for protecting the piezoelectric vibrator 3 and the visco-elastic members 5 from being damaged by extrinsic impacts or shocks. Furthermore, the cover 17 serves as an acoustic equalizer for the soundwaves which are generated by the vibration of the piezoelectric vibrator 3, thereby broadening the directivity in the higher frequency range and providing flatter reproduction characteristics.

Although the cover 17 Illustrated in FIGS. 35Ac and 35B is only provided on one side of the piezoelectric vibrator 3, it is also possible to provide a cover 17 on each side of the piezoelectric vibrator 3. In this case, separate positive lead wires 6A would not be required.

By at least partially constructing the cover 17 from a conductive material in such a manner that the cover 17 is insulated from a diaphragm 1 (to which a negative (−) electrical input is applied), all of the electric input terminals can be provided in the vicinity of the junction between the cover 17 and the frame 4. This makes for improved appearances and facility of use, and also substantially eliminates malfunctioning possibilities due to severance or entanglement of lead wires.

Although the cover 17 as illustrated in FIG. 35B includes three fans, any number of fans may be provided in accordance with the desired acoustic equalizer configuration.

EXAMPLE 20

Figure 36A:
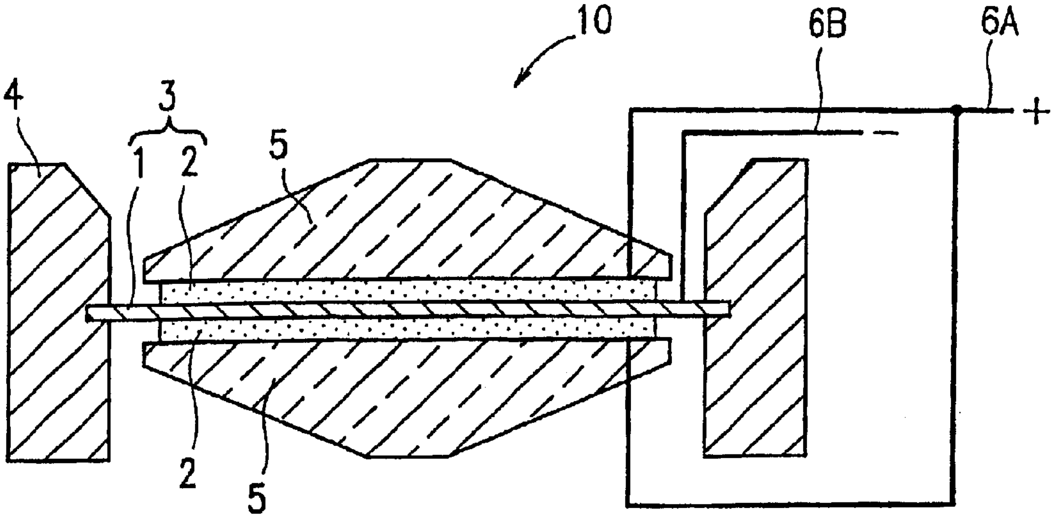
FIG. 36A is a cross-sectional view showing a piezoelectric loudspeaker according to Example 20 of the present invention.
Figure 36B:
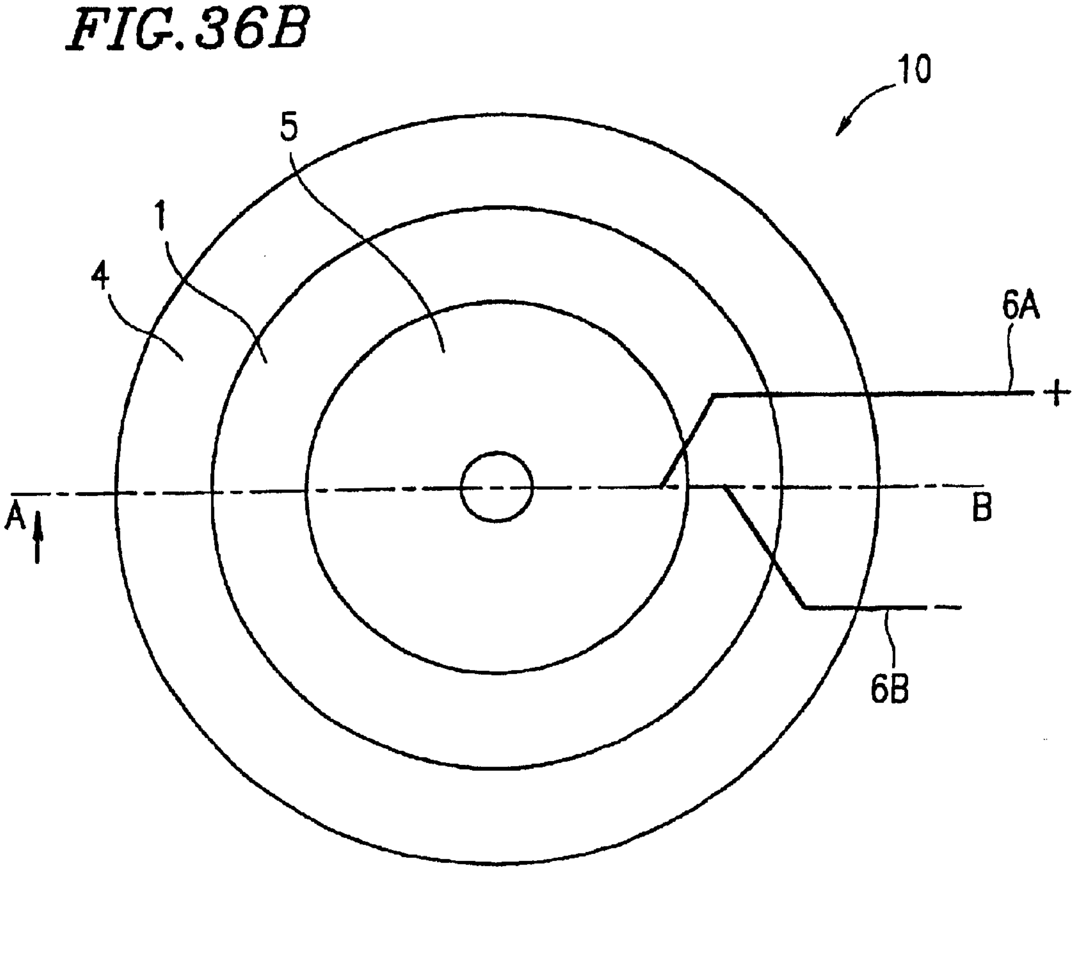
FIG. 36B is a plan view showing a piezoelectric loudspeaker according to Example 20 of the present invention.

FIGS. 36A and 36B are a cross-sectional view and a plan view, respectively, showing a piezoelectric loudspeaker 10 according to Example 20 of the present invention. As shown, visco-elastic members 5 provided upon a piezoelectric member 2 each have a bottom face area which is equal to or greater than the bottom face area of the piezoelectric member 2 and yet small enough to fit within the inner diameter of the frame 4 (i.e., the diameter of the visco-elastic member 5 is smaller than the inner diameter of the frame 4). As a result, the visco-elastic members 5 serve as means for protecting the piezoelectric member 2 from extrinsic impacts or shocks, and/or preventing foreign articles from straying into the speaker system to cause peeling of, or inflict damage to, the piezoelectric member 2.

EXAMPLE 21

Figure 37:
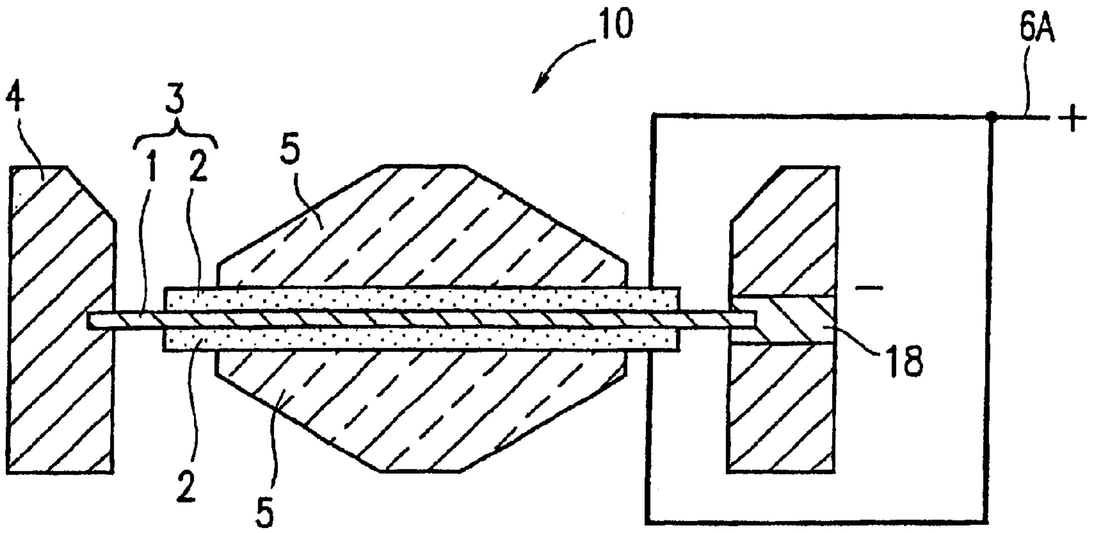
FIG. 37 is a cross-sectional view showing a piezoelectric loudspeaker according to Example 21 of the present invention.

FIG. 37 is a cross-sectional view showing a piezoelectric loudspeaker 10 according to Example 21 of the present invention. As shown, a negative (−) electric terminal 18 which is composed of a conductive material is provided in a portion of a frame 4 so as to be in electrical contact with a diaphragm 1. The negative electric terminal 18 eliminates the need for a separate negative lead wire, thereby eliminating malfunctioning possibilities due to severance or entanglement of lead wires. Since the negative electric terminal is constructed simply by affixing the diaphragm 1 to the frame 4, the number of manufacture steps can be reduced, thereby facilitating ease of assembly. The appearances of the piezoelectric loudspeaker 10 can also be improved according to the present example.

Although the piezoelectric loudspeaker 10 illustrated in FIG. 37 is of a type which incorporates a positive lead wire 6A, any of the structures shown in FIGS. 22, 32, 33, 35A and 35B, in which there is no need for at least one of the positive lead wires, can suitably incorporate the negative electric terminal 18 according to the present example for the aforementioned effects. It is also possible to provide a positive electric terminal(s) within the frame 4 in addition to the negative electric terminal 18. Although two visco-elastic members 5 are illustrated as being provided on opposite sides of the piezoelectric vibrator 3, one visco-elastic member 5 may be provided on only one side of the piezoelectric vibrator 3.

In general, the configuration of the diaphragm, piezoelectric member, frame, and visco-elastic member of the piezoelectric loudspeaker 10 according to the present invention may be disk-like or annular. However, they may alternatively have polygonal shapes. It is also possible that some of these elements have one shape while others have another. By appropriately selecting the configurations, materials, positions, etc. for the respective constituent elements of the piezoelectric loudspeaker 10 according to the present invention, it is possible to design a loudspeaker which provides the desired characteristics, good space economy, and good appearances.

Thus, according to the present invention, there is provided a structure in which a visco-elastic member is attached to a central portion of a piezoelectric vibrator which is composed essentially of a diaphragm and a piezoelectric member(s) attached to one side or both sides of the diaphragm, such that the bottom face area of the visco-elastic member accounts for about 11% to about 80% of the bottom face area of the diaphragm. The present invention provides the outstanding advantages, such as ability to control the resonance modes of a piezoelectric vibrator without allowing the vibratory energy to be leaked to a supporting frame or the like, thereby realizing a piezoelectric loudspeaker which has a high sound volume level and flat, reproduced sound volume-frequency characteristics.

By incorporating an element within a visco-elastic member so that the element is affixed to the piezoelectric vibrator, it becomes possible to minimize the excessive amplitude occurring in the central portion of the piezoelectric vibrator, thereby providing for improved withstand input level.

By providing notches in a visco-elastic member so as not to entirely cover a junction portion for coupling a positive lead wire to a piezoelectric member, it can be ensured that the visco-elastic member is in close contact with the piezoelectric vibrator. As a result, the damping effects by the visco-elastic member can be fully realized, thereby providing for stable sound volume characteristics.

By providing an element, which is at least partially conductive, for supporting the substantial center of the piezoelectric vibrator, and applying an electric input to the conductive portion of the element, the excessive amplitude occurring in the central portion of the piezoelectric vibrator can be minimized, thereby providing for improved withstand input level. This results in a reduced number of lead wires, which reduces malfunctioning possibilities and improves production yield.

By inserting an electrical resistance between a piezoelectric vibrator and at least one lead wire, a low-pass filter can be constructed for controlling the reproduction band width.

By dividing a piezoelectric vibrator into concentric sections or vertically split sections, and inserting an electrical resistance or a conductive material having high resistance between such sections, a low-pass filter can be constructed in the split piezoelectric vibrator so that the piezoelectric vibrator operates as a composite loudspeaker. As a result, the reproduction band width can be expanded.

By providing a plate for coupling a visco-elastic member to a frame, the excessive amplitude in the central portion of the piezoelectric vibrator can be minimized, and an acoustic element can be constructed within the space between the plate, the piezoelectric vibrator, and the frame, thereby enabling adjustment of sound volume characteristics.

By providing a through-hole in the diaphragm through which one of positive wires is coupled to the piezoelectric vibrator, improved appearances can be provided, and malfunctioning possibilities associated with severance of lead wires are reduced.

By providing a cover and an electric input terminals on at least the front side or the back side of the piezoelectric loudspeaker, the sound volume characteristics can be improved, the piezoelectric loudspeaker can be protected from extrinsic impacts or shocks, and a reduced number of lead wires decreases malfunctioning possibilities and improves the appearances of the piezoelectric loudspeaker.

By ensuring that the visco-elastic member has a bottom face area which is equal to or greater than the bottom face area of the piezoelectric member and yet small enough to fit within the inner diameter of the frame, the visco-elastic member can serve as a means for protecting the piezoelectric member.

By providing a conductive portion within the frame, the conductive portion being in electrical contact with the diaphragm, a negative lead wire can be omitted, thereby making for improved appearances and production facility and substantially eliminating malfunctioning possibilities.

Throughout the specification, the term “member” (e.g., “visco-elastic member”, “piezoelectric member”, etc.) is employed in its broadest sense. That is, a “member” refers to any piece or amount of material taking a definite or indefinite shape such that the “member” satisfies the aforementioned dimensional requirements as appropriate.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A piezoelectric loudspeaker comprising:

a piezoelectric vibrator including a diaphragm and a piezoelectric member provided on at least one face of the diaphragm, the diaphragm being vibrated by the piezoelectric member;

a frame for supporting the piezoelectric vibrator; and a visco-elastic member provided on at least one face of the piezoelectric vibrator, the visco-elastic member being disposed in a substantial center of the piezoelectric vibrator, the visco-elastic member having a bottom face area which accounts for about 11% to about 80% of a bottom face area of the diaphragm, the visco-elastic member comprising first and second visco-elastic members provided on opposite sides of the piezoelectric vibrator, and the first and second visco-elastic members comprising different materials or different shapes.

2. A piezoelectric loudspeaker according to claim 1, wherein a rigid member is provided on the visco-elastic member, the rigid member having a specific gravity which is larger than a specific gravity of the visco-elastic member.

3. A piezoelectric loudspeaker according to claim 1 further comprising an element provided in a central portion of the visco-elastic member, at least one of specific gravity and elastic modulus of the element being larger than specific gravity and/or elastic modulus of the visco-elastic member.

4. A piezoelectric loudspeaker according to claim 1 further comprising a lead wire for applying an electric input to the piezoelectric member, wherein the piezoelectric vibrator has at least one through-hole through which the lead wire is coupled to the piezoelectric member.

5. A piezoelectric loudspeaker according to claim 1 further comprising a cover for protecting at least one said visco-elastic member and the piezoelectric vibrator.

6. A piezoelectric loudspeaker according to claim 5 further comprising a conductive terminal for applying an electrical input to the piezoelectric member, the conductive terminal being provided within the cover.

7. A piezoelectric loudspeaker according to claim 1, wherein the frame includes a conductive portion which is in electrical contact with the piezoelectric vibrator, and an electrical input is applied to the conductive portion.

8. A piezoelectric loudspeaker comprising:

a piezoelectric vibrator including a diaphragm and a piezoelectric member provided on at least one face of the diaphragm, the diaphragm being vibrated by the piezoelectric member;

a frame for supporting the piezoelectric vibrator; and a visco-elastic member provided on at least one face of the piezoelectric vibrator, the visco-elastic member being disposed in a substantial center of the piezoelectric vibrator, the visco-elastic member having a bottom face area which accounts for about 11% to about 80% of a bottom face area of the diaphragm, the visco-elastic member including two or more visco-elastic members stacked on top of each other, and the two or more visco-elastic members comprising different materials or different shapes.

9. A piezoelectric loudspeaker comprising:

a piezoelectric vibrator including a diaphragm and a piezoelectric member provided on at least one face of the diaphragm, the diaphragm being vibrated by the piezoelectric member;

a frame for supporting the piezoelectric vibrator; and a visco-elastic member provided on at least one face of the piezoelectric vibrator, the visco-elastic member being disposed in a substantial center of the piezoelectric vibrator, the visco-elastic member having a bottom face area which accounts for about 11% to about 80% of a bottom face area of the diaphragm, the visco-elastic member comprising two or more visco-elastic members having mutually different values in at least one of specific gravity, Young's modulus, and internal loss, and the two or more visco-elastic members are disposed in a concentric manner.

10. A piezoelectric loudspeaker comprising:

a piezoelectric vibrator Including a diaphragm and a piezoelectric member provided on at least one face of the diaphragm, the diaphragm being vibrated by the piezoelectric member;

a frame for supporting the piezoelectric vibrator; and a visco-elastic member provided on at least one face of the piezoelectric vibrator, the visco-elastic member being disposed in a substantial center of the piezoelectric vibrator, the visco-elastic member having a bottom face area which accounts for about 11% to about 80% of a bottom face area of the diaphragm, and the piezoelectric vibrator having at least one aperture, the at least one aperture being at least partially filled by the visco-elastic member.

11. A piezoelectric loudspeaker comprising:

a piezoelectric vibrator including a diaphragm and a piezoelectric member provided on at least one face of the diaphragm, the diaphragm being vibrated by the piezoelectric member;

a frame for supporting the piezoelectric vibrator; and a visco-elastic member provided on at least one face of the piezoelectric vibrator, the visco-elastic member being disposed in a substantial center of the piezoelectric vibrator, the visco-elastic member having a bottom face area which accounts for about 11% to about 80% of a bottom face area of the diaphragm, the frame having a horn-like configuration including an opening, the opening having a gradually increasing cross-sectional area away from the piezoelectric vibrator and toward a final opening at which soundwaves are emitted, and the visco-elastic member having a conical configuration having a gradually decreasing cross-sectional area away from the piezoelectric vibrator and toward the final opening.

12. A piezoelectric loudspeaker comprising:

a piezoelectric vibrator including a diaphragm and a piezoelectric member provided on at least one face of the diaphragm, the diaphragm being vibrated by the piezoelectric member;

a frame for supporting the piezoelectric vibrator; and a visco-elastic member provided on at least one face of the piezoelectric vibrator, the visco-elastic member being disposed in a substantial center of the piezoelectric vibrator, the visco-elastic member having a bottom face area which accounts for about 11% to about 80% of a bottom face area of the diaphragm, the visco-elastic member including notches in at least one portion thereof.

13. A piezoelectric loudspeaker comprising:

a voltage applying means for applying a plurality of voltages;

a piezoelectric vibrator Including a diaphragm and a plurality of piezoelectric members provided on at least one face of the diaphragm, the diaphragm being vibrated by the plurality of piezoelectric members;

a frame for supporting the piezoelectric vibrator;

wherein at least two of the plurality or piezoelectric members have a different voltage applied thereto from the voltage applying means; and an electrically resistant element for interconnecting at least two of the plurality of piezoelectric members.

14. A piezoelectric loudspeaker comprising:

a piezoelectric vibrator Including a diaphragm and a piezoelectric member provided on at least one face of the diaphragm, the diaphragm being vibrated by the piezoelectric member;

a frame for supporting the piezoelectric vibrator;

a visco-elastic member provided on at least one face of the piezoelectric vibrator, the visco-elastic member being disposed in a substantial center of the piezoelectric vibrator, and the visco-elastic member having a bottom face area which accounts for about 11% to about 80% of a bottom face area of the diaphragm; and a plate for connecting at least one said visco-elastic member to the frame so as to damp unwanted vibration of the piezoelectric vibrator, an enclosed space being formed by the plate, the frame, and the diaphragm.

15. A piezoelectric loudspeaker according to claim 14, wherein the plate has at least through-hole.

16. A piezoelectric loudspeaker according to claim 14, wherein the visco-elastic member includes a conductive portion which is in electrical contact with the piezoelectric vibrator, and an electrical input is applied to the conductive portion.

17. A piezoelectric loudspeaker comprising:

a piezoelectric vibrator including a diaphragm and a piezoelectric member provided on at least one face of the diaphragm, the diaphragm being vibrated by the piezoelectric member;

a frame for supporting the piezoelectric vibrator; and a visco-elastic member provided on at least one face of the piezoelectric vibrator, the visco-elastic member being disposed in a substantial center of the piezoelectric vibrator, the visco-elastic member having a bottom face area which accounts for about 11% to about 80% of a bottom face area of the diaphragm, and the visco-elastic member having a conical configuration having a gradually decreasing cross-sectional area away from the piezoelectric vibrator and toward a final opening.

* * * * *

UNITED STATES PATENT AND TRADEMARK OFFICE

CERTIFICATE OF CORRECTION

PATENT NO. : 6,747,395 B1 Page 1 of 1
DATED : June 8, 2004
INVENTOR(S) : Kazue Sotoh et al.

It is certified that error appears in the above-identified patent and that said Letters Patent is hereby corrected as shown below:

Column 22,
Line 15, the word “Including” should read -- including --.

Signed and Sealed this

Twenty-first Day of December, 2004

JON W. DUDAS
*Director of the United States Patent and Trademark Office*